(12) United States Patent
Takashima et al.

(10) Patent No.: US 6,979,901 B2
(45) Date of Patent: Dec. 27, 2005

(54) SEMICONDUCTOR HEAT-DISSIPATING SUBSTRATE, AND MANUFACTURING METHOD AND PACKAGE THEREFOR

(75) Inventors: Kouichi Takashima, Itami (JP); Shin-ichi Yamagata, Itami (JP); Yugaku Abe, Itami (JP); Akira Sasame, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/433,933

(22) PCT Filed: Aug. 23, 2002

(86) PCT No.: PCT/JP02/08542

§ 371 (c)(1),
(2), (4) Date: Oct. 21, 2003

(87) PCT Pub. No.: WO03/021671

PCT Pub. Date: Mar. 13, 2003

(65) Prior Publication Data

US 2004/0135247 A1 Jul. 15, 2004

(30) Foreign Application Priority Data

Aug. 31, 2001 (JP) .................................. 2001-263043
Jul. 8, 2002 (JP) .................................. 2002-199128

(51) Int. Cl.[7] ............................................. H01L 23/34
(52) U.S. Cl. ......................................................... 257/712
(58) Field of Search ............................... 257/712, 713, 257/720

(56) References Cited

U.S. PATENT DOCUMENTS

| 3,568,852 A | 3/1971 | Howard |
| 3,984,002 A | 10/1976 | Howard |
| 4,680,618 A * | 7/1987 | Kuroda et al. ............... 257/746 |
| 4,997,114 A | 3/1991 | Petrou |
| 5,086,333 A * | 2/1992 | Osada et al. ................. 257/677 |
| 5,099,310 A * | 3/1992 | Osada et al. ................. 361/718 |
| 5,481,136 A | 1/1996 | Kohmoto et al. |
| 5,503,010 A | 4/1996 | Yamanaka |
| 5,881,931 A | 3/1999 | Stanfield |
| 6,114,048 A | 9/2000 | Jech et al. |
| 6,170,679 B1 | 1/2001 | Frye et al. |
| 6,219,364 B1 | 4/2001 | Dei |
| 6,726,067 B2 | 4/2004 | Louw |

FOREIGN PATENT DOCUMENTS

| EP | 0482812 A2 | 10/1991 |
| EP | 0859410 A2 | 8/1998 |
| JP | 59-141248 A | 8/1984 |
| JP | 04-348062 A | 3/1992 |
| JP | 05-003265 A | 8/1993 |
| JP | 10-088272 A | 4/1998 |
| JP | 10-280082 A | 10/1998 |

* cited by examiner

*Primary Examiner*—David A. Zarneke
(74) *Attorney, Agent, or Firm*—James Judge

(57) ABSTRACT

In a semiconductor heat-dissipating substrate made of a Cu—W alloys whose pores have been infiltrated with copper, being a porous tungsten body whose pore diameter at a specific cumulative surface area of 95% is 0.3 μm or more, and whose pore diameter at a specific cumulative surface area of 5% is 30 μm or less, thermal conductivity of 210 W/m·K or more is obtained by decreasing the content of iron-family metal to be less than 0.02 weight %. Likewise, changing the amount of infiltrated copper in a molded object by utilizing a multi-shaft press to vary the amount of vesicles in the middle and peripheral portions makes for offering at low cost a semiconductor heat-dissipating substrate that in between middle and peripheral portions made of different materials does not have bonding matter.

20 Claims, 10 Drawing Sheets

SEMICONDUCTOR HEAT-DISSIPATING SUBSTRATE, AND MANUFACTURING METHOD AND PACKAGE THEREFOR

TECHNICAL FIELD

The present invention relates to: semiconductor heat-dissipating substrates that are superiorly heat dissipative and suitable for high-frequency devices and for semiconductor light-emitting devices, whose semiconductor elements produce a large amount of heat; to manufacturing methods therefor; and to packages and submounts, as well as semiconductor devices, utilizing the substrates.

BACKGROUND ART

While semiconductors have taken on widely spanning roles as arithmetic elements and storage devices in personal computers and other computers, due to the rapid spread of mobile communications and to advances in high-capacity communications in recent years, applications in output devices for high-frequency amplification in base stations for these communications forms are broadening quickly.

Semiconductor devices are generally assembled into a package made up of a semiconductor heat-dissipating substrate, as well as input/output terminals and seal rings, and because the Si (silicon)—bipolar semiconductors widely used to date require isolation, they have been populated onto insulating substrates made of a semiconductor substrate onto which BeO (beryllia) is bonded. On the other hand, being that they do not require isolation Si—LDMOS and GaAs—FET semiconductors, outstanding in high-frequency characteristics, may be surface-mounted directly onto semiconductor heat-dissipating substrates.

Nevertheless, attendant on the heightened output from high-frequency devices and semiconductor light-emitting devices in recent years, the amount of heat issuing from these semiconductor components has increased significantly, and consequently packages and heat sinks having heightened heat-dissipating properties are being called for. Given such circumstances, the role of semiconductor heat-dissipating substrates is becoming more and more important; and semiconductor heat-dissipating substrates having further heightened thermal conductivity in order to improve their heat-dissipating properties are being sought.

Moreover, if a package becomes warped, because gaps will arise between it and the semiconductor heat-dissipating substrate—onto which fins or like devices for dissipating heat externally are attached—the heat-dissipating properties will be considerably spoiled. For example, a semiconductor heat-dissipating substrate, after being processed into the necessary form, is normally plated with Ni, whereupon terminals for external connections and seal rings for airtight sealing are bonded in place by brazing and the assembly is made into a package; a heating process is generally included in the Ni-plating procedure, however, in order to improve the adherence of the Ni plating, and due to the impact of the heat warpage is liable to occur in the package.

In brazing, furthermore, it is extremely important that the thermal expansion coefficients of the alumina, beryllia, and Fe—Ni—Co alloys used as the terminals and seal rings that are brazed, and of the semiconductor heat-dissipating substrate are compatible. For example, although copper has a high thermal conductivity of approximately 393 W/m·K, what with its thermal expansion coefficient being a large $17 \times 10^{-6}/°$ C., it cannot be employed as a semiconductor heat-dissipating substrate. On the other hand, alloys and composites made of copper and tungsten (referred to simply as "copper-tungsten alloys" or "Cu—W alloys" hereinafter), can be made compatible in thermal expansion coefficient with the above-noted materials by changing the copper and tungsten percentage composition; moreover, because of their high rigidity, incidents of warping due to heat are held down, and therefore they are widely employed as semiconductor heat-dissipating substrates.

A method of fabricating semiconductor heat-dissipating substrates from such Cu—W alloys is proposed in Japanese Pub. Pat. App. No. S59-141248. In particular, they are fabricated by pressure-molding a powder in which 0.02-2 weight % of an iron-family metal is added to tungsten powder 1 to 40 $\mu$m in average particle diameter, and subsequently sintering it in a non-oxidizing atmosphere into a porous sintered body, which is impregnated with copper in a weight ratio of 5 to 25 weight %.

Likewise, a composite member made of a copper-tungsten alloy is proposed in Japanese Pub. Pat. App. No. H10-280082, the composite/alloy member—in particular, a non-machined or partially machined Cu—W alloy—characterized in that surfaces of the copper and tungsten having no fractured areas are exposed over the entire peripheral surface except for the crossover portions of the plurality of faces, and in that it is not lacking in tungsten grains. The characteristics obtained with Cu—W alloys as determined by this manufacturing process are that with for example an alloy whose thermal expansion coefficient is $6.5 \times 10^{-6}/°$ C., the thermal conductivity is 210 W/m·K, and that the pre- and post-Ni-plating warpage together is 0.01 mm.

In Japanese Pub. Pat. App. No. H4-348062, furthermore, a heat-dissipating semiconductor-carrier substrate, in which a plurality of Cu—W alloy pieces are overlaid and bonded via copper, is proposed. For example, overlaying a flat plate 1, whose form is 7 mm×7 mm×0.5 mm and whose weight composition is Cu:W=20:80, and a flat plate 2, whose form is 30 mm×11 mm×1 mm and whose weight composition is Cu:W=10:90, with copper foil sandwiched in between, and bonding by heat-fusing the copper foil, yields a substrate stepped in form. After brazing at the same time with an alumina frame and a beryllia plate, actual bottom warpage in the package is supposed to be 0.002 mm or less. Likewise, proposed in Japanese Pub. Pat. App. No. H5-3265 is a composite heat-dissipating semiconductor-carrier substrate, in which porous sintered tungsten parts of two kinds differing in density are overlaid and bonded while simultaneously being infiltrated with molten copper.

In addition, a composite heat-dissipating semiconductor-carrier substrate characterized in that porous sintered tungsten parts of at least two kinds differing in density are bonded by copper-infiltration is put forth in Japanese Pub. Pat. App. No. H5-3265 as well as U.S. Pat. No. 5,481,136. What is proposed is to establish the one to contain 5 to 25 weight % Cu, and the other to contain 40 to 70 weight % Cu. In particular, making the peripheral portion a Cu—W alloy with the greater amount of Cu is supposed to match its thermal expansion coefficient to that of plastic packages or flexible printed-circuit boards and make for improving the reliability of the semiconductors or packages.

Furthermore, in a semiconductor module having a metal substrate that carries a semiconductor laser-diode chip and a lens, and onto the under part of which a Peltier element is adhered via metal solder, Japanese Pub. Pat. App. No. H10-200208 as well as U.S. Pat. No. 6,219,364 proposes that utilizing a metal substrate made from a first metal substance whose thermal expansion coefficient is large, on an encompassing side of side of a metal component whose thermal expansion coefficient is smaller than that of the first metal substance, serves to improve the cooling potential and gains reliance in thermal environments. Brazing or penetrant-bonding the materials are ways proposed for fabricating the metal substrates.

A functionally-graded metal substrate, moreover, is proposed in U.S. Pat. No. 6,114,048. The functionally-graded metal substrate has a structure in which a minimum of two kinds of metal—wherein the thermal conductivity of the middle portion is higher than that of the peripheral portion, while the peripheral portion has a lower thermal expansion coefficient than that of the middle portion—are composited in the horizontal plane (x-y plane) used for mounting semiconductors.

DISCLOSURE OF INVENTION

Semiconductor heat-dissipating substrates of Cu—W alloys are generally manufactured, as mentioned in the above-noted Japanese Pub. Pat. App. No. S59-141248, by fabricating a porous tungsten body and then contacting it with molten copper to infiltrate the pores within the porous tungsten body with the copper. A drawback nevertheless has been that iron-family metal added in order to promote infiltration of the copper acts as a dispersant to the flow of heat, which diminishes the most important characteristic of a semiconductor heat-dissipating substrate—its thermal conductivity.

In situations in which copper infiltration is carried out employing large-scale furnaces for mass production in particular, due to so-called irregularities in manufacturing parameters, such as fluctuations in furnace interior temperature and oxygen gas flow, and the influence of differences in charge volume, products that have not been completely infiltrated are sometimes produced. Iron-family metals such as iron, nickel and cobalt are made into solid solutions with tungsten; what is more, in order to improve the wettability of the tungsten for copper—in order to achieve adequate copper infiltration—mixing iron-family metal with tungsten powder has been indispensable.

Nevertheless, consequent upon the heightening of device output in recent years, instances of conventional Cu—W alloys being inadequate in thermal conductivity as heat-dissipating substrates have arisen. For example, with a W-11 wt. % Cu alloy whose thermal expansion coefficient is compatible with alumina, approximately 0.2 wt. % Ni is used as an additive metal, and the thermal conductivity is 180 W/m·K; but cases in which conditions cannot be met with this thermal conductivity have been on the rise.

Here, other than being intentionally added, an iron-family metal such as nickel is in some cases admixed in a powder-mixing, pulverizing or like process. For example, even though with Cu—W alloy No. 3 in Table 2 in the above-noted Japanese Pub. Pat. App. No. H10-280082 there is no additive metal, 0.09 weight % iron is admixed during pulverization using steel balls, and this metal takes on the work of improving the wettability of tungsten for copper. At the same time, however, the thermal conductivity of the Cu—W alloy is impaired, and consequently the thermal conductivity of the Cu—W alloy stays at 210 W/m·K.

The thermal conductivity of elemental tungsten originally is 167 W/m·K, and of elemental copper, 393 W/m·K, and with the aforementioned W-11 wt. % Cu alloy the theoretical limit should therefore be 220 W/m·K. The difference with the theoretical value is assumed to be on account of the presence of various heat-flow dissipating factors such as interfacial and crystalline distortions, and impurities. Cu—W alloys in which heat dispersing factors are reduced to the utmost, and the thermal conductivity is furthermore improved have therefore been eagerly sought.

Circumstances of late have gotten to be such that heat-dissipating substrates whose thermal conductivity is even 250 W/m·K or more and near that of copper are being called for, but realizing this with conventional Cu—W elemental alloys is difficult. For this reason it has become necessary to utilize Cu—W alloy for the parts where compatibility in thermal expansion coefficient with the brazing portions is important, and to utilize highly heat-conducting copper, or else Cu—W alloy in which the amount of copper is ample, in the parts, such as the areas on which semiconductors are mounted, where heat-dissipating capacity is important; and many techniques regarding methods of compositing either copper or a number of Cu—W alloy pieces have been proposed.

Being that compositing methods to date, however, select a technique for obtaining a single composite material by combining a number of either Cu—W alloy pieces or porous tungsten parts prepared beforehand—as is noted in the previously mentioned Japanese Pub. Pat. App. No. H4-348062 and Japanese Pub. Pat. App. No. H5-3265—elevated costs cannot be avoided because the plurality of Cu—W alloy pieces or else the porous tungsten parts are manufactured in separate processes.

Moreover, in compositing by combining a number of either Cu—W alloy pieces or porous tungsten parts prepared beforehand, if a brazing or like technique is adopted, a problem arises in that due to the intervention of the brazing substance or like bonding material the thermal conductivity deteriorates. There have been problems besides, in that with the technique of joining the copper by a rolling method, controlling the thickness of each layer is problematic, and the thermal expansion coefficient, thermal conductivity and like characteristics fluctuate. A heat-dissipating substrate made from a low-cost, high-quality composite Cu—W alloy, and a method of manufacturing it have therefore been eagerly sought.

In order to improve the heat-dissipating properties of a semiconductor substrate having a composite makeup, it is desirable to make where it is directly beneath where the semiconductors are carried a material having a higher thermal conductivity.

With the stepped makeup mentioned in the above-noted Japanese Pub. Pat. App. No. H4-348062, a structure in which directly beneath the semiconductor-carrying portion, rather than a W-10 weight % Cu elemental material, is highly heat conducting W-20 weight % Cu, wherein the amount of Cu is larger, is superiorly heat-dissipative. This structure is impaired, however, in that heat is conducted via a W-10 weight % Cu flat plate. That is, a makeup in which heat is conveyed directly to heat-dissipating understructures such as fins—as is proposed in U.S. Pat. No. 6,114,048—excels in heat-dissipating properties.

In making this structure practicable, moreover, controlling warpage has proved to be a mandatory issue. In particular, owing to the fact that several materials are combined in the structure, stress is liable to remain in the interior of the semiconductor substrate; and when the substrate heats up, because the stress is liberated, warpage is exceedingly likely to occur. Also, when by means of brazing the substrate is bonded with surrounding mechanical devices of alumina and electrode material made of cobalt, warpage has been liable to occur due to thermal expansion discrepancies, and irregularities have especially tended to grow greater. Consequently, with technology to date, semiconductor devices have only been put to use sorted according to extent of warpage after having being assembled. Moreover, not only the size of the warpage, but also the direction has turned out to be a problem. In particular, warpage such that straight under the semiconductor it is earthed is superiorly heat dissipative; but if in the opposite direction warpage will end up inferiorly heat-dissipative, because it will be earthed from straight under the semiconductor through grease or the like.

Taking into consideration such circumstances to date, an object of the present invention is to provide a heat-dissipating substrate, and a method of its manufacture, made of a Cu—W alloy in which the iron-family metal that proves to be a heat-dispersing factor is reduced and the thermal conductivity is improved over the conventional. It is also an object to offer a low-cost, high-quality semiconductor heat-dissipating substrate, and a method of its manufacture, in which a plurality of Cu—W alloys, or it and copper is combined to further heighten the thermal conductivity.

In order to achieve the above-noted objective, a first semiconductor heat-dissipating substrate that the present invention provides is made of a copper-tungsten alloy being a porous tungsten body into the pores of which copper has been infiltrated; the semiconductor heat-dissipating substrate characterized in that pore diameter of the porous tungsten body at a specific cumulative surface area of 95% is 0.3 $\mu$m or more, and pore diameter of the porous tungsten body at a specific cumulative surface area of 5% is 30 $\mu$m or less. Preferably, the pore diameter of the porous tungsten body at a specific cumulative surface area of 95% is 0.5 $\mu$m or more.

In the above-noted first semiconductor heat-dissipating substrate of the present invention, the content of iron-family metal within the copper-tungsten alloy may be made 0.02 weight % or less, more preferably 0.002 weight % or less. As a result, when the tungsten in the semiconductor heat-dissipating substrate of the present invention is present at 91 to 75 weight %, near the logical value, 210 W/m·K or more in thermal conductivity can be obtained; and when the tungsten is present at 81 to 75 weight %, and 230 W/m·K or more thermal conductivity can be.

In addition, the present invention provides a method manufacturing a semiconductor heat-dissipating substrate made of a copper-tungsten alloy being a porous tungsten body into the pores of which copper has been infiltrated, that is a method of manufacturing a semiconductor heat-dissipating substrate including: a step of mixing tungsten powder and an organic binder; a step of pressure-molding the powder mixture; a step of heating the molded object to eliminate the organic binder therefrom; and a step of infiltrating molten copper into the porous tungsten body being in that state or having been intermediately sintered; and characterized in that powder of 0.5 $\mu$m or less grain size contained in the tungsten powder is present in a 5% or less amount, and powder of 50 $\mu$m or more grain size is present in a 5% or less amount.

In the method of manufacturing the above-noted first semiconductor heat-dissipating substrate, iron-family-metal powder may be further added at less than 0.02 weight % to the tungsten powder, the additive amount of the iron-family-metal powder preferably being 0.002 weight % or less. Further, the amount of the organic binder added to the tungsten powder is preferably 0.2 weight % or less.

In addition, a second semiconductor heat-dissipating substrate that the present invention provides is characterized in: being made of a copper-tungsten alloy that is a porous tungsten body into the pores of which copper has been infiltrated and composed of a semiconductor-element-carrying central portion and a portion peripheral thereto that differ in substance, the central portion made of copper or of a substance containing more copper than the peripheral portion; and being formed integrally without the central portion and the peripheral portion being interrupted by bonding matter.

In the above-noted second semiconductor heat-dissipating substrate, the substance that composes the central portion and the substance that composes the peripheral portion differ in thermal conductivity and/or thermal expansion coefficient. Also, 250 W/m·K or more in thermal conductivity of the substance that composes the central portion can be produced with the second semiconductor heat-dissipating substrate.

In the foregoing second semiconductor heat-dissipating substrate, preferably copper is contained at 30 weight % or more in the central portion, and copper is contained at less than 30 weight % in the peripheral portion. Further preferable is that copper is contained at 10 weight % or less in the peripheral portion. Moreover, preferably the substrate is utilized without its peripheral side face undergoing grinding or polishing procedures, and its dimensional accuracy is ±2 $\mu$m per millimeter.

As a first method among methods that the present invention provides of manufacturing the second semiconductor heat-dissipating substrate is a method of manufacturing a semiconductor heat-dissipating substrate composed of a semiconductor-element-carrying central portion and a portion peripheral thereto that differ in substance, characterized in: forming a porous tungsten body in which vesicle proportion in its central portion is made larger than in its peripheral portion by varying compression on the central portion and peripheral portion in a process of molding them from a tungsten powder; and infiltrating molten copper into the porous tungsten body.

As a second method among methods of manufacturing the foregoing second semiconductor heat-dissipating substrate is a method of manufacturing a semiconductor heat-dissipating substrate composed of a semiconductor-element-carrying central portion and a portion peripheral thereto that differ in substance, characterized in: forming a porous tungsten body whose central portion and peripheral portion differ in composition, by varying the percentages of tungsten powder and additive metal powder in the central portion and the peripheral portion in a process of molding them from a tungsten powder; and infiltrating molten copper into the porous tungsten body obtained.

As a third method among methods of manufacturing the above-mentioned second semiconductor heat-dissipating substrate is a method of manufacturing a semiconductor heat-dissipating substrate composed of a semiconductor-element-carrying central portion and a portion peripheral thereto that differ in substance, characterized in: infiltrating molten copper into a porous tungsten body obtained in a process of molding a tungsten powder by in its central portion forming a recess or otherwise forming a plurality of penetrating or non-penetrating small holes; and simultaneously filling the recess or small holes with copper.

As a forth method among methods of manufacturing the foregoing second semiconductor heat-dissipating substrate is a method of manufacturing a semiconductor heat-dissipating substrate composed of a semiconductor-element-carrying central portion and a portion peripheral thereto that differ in substance, characterized in: forming a porous tungsten body centrally having a through-hole; infiltrating molten copper into the porous tungsten body and afterwards pressing a copper piece into the central through-hole, or pressing a copper piece into the central through-hole in the porous tungsten body and afterwards infiltrating it with molten copper; and thereafter heat-treating the porous tungsten body.

The present invention provides a package utilizing either the foregoing first or second semiconductor heat-dissipating substrate as set forth by the invention, or utilizing a semiconductor heat-dissipating substrate that satisfies the conditions of the first or second semiconductor heat-dissipating substrates, wherein a seal ring and an electrode terminal are brazed on the peripheral portion thereof. A package of the present invention is characterized in that warpage in said semiconductor heat-dissipating substrate after said seal ring and said electrode terminal have been brazed onto it is 1 μm or less per millimeter length.

The present invention, furthermore, provides a submount characterized in being furnished with: a submount substrate utilizing either the foregoing first or second semiconductor heat-dissipating substrate; and a solder layer on an optical-semiconductor-element-carrying principal face of said submount substrate.

In a submount of the present invention, a chamfer edgewise on said optical-semiconductor-element-carrying principal face preferably measures 30 μm or less. Further, it is preferable that on at least one side face of said submount a solder layer is formed continuously from said solder layer on the principal face, or that on all side faces of said submount a solder layer is formed continuously from said solder layer on the principal face.

Additionally, the present invention provides a semiconductor device wherein an optical semiconductor element is mounted in place on the foregoing submount, and a stem is connected to the reverse face on its opposite side.

BEST MODE FOR CARRYING OUT THE INVENTION

Figure 1A:
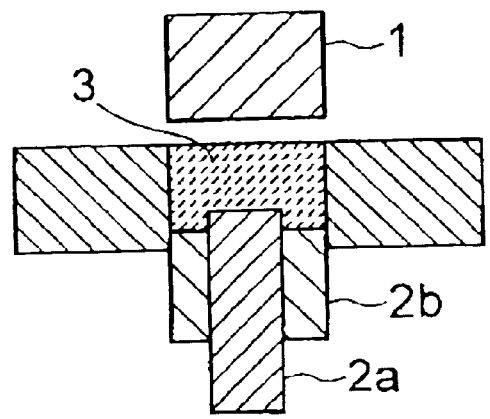
FIG. 1 is an explanatory diagram illustrating one specific example, under the present invention, of a method of manufacturing a molding form utilized in fabricating a semiconductor heat-dissipating substrate composed of a central portion and a peripheral portion that differ in material properties.

As a result of investigating the infiltration of porous tungsten bodies with molten copper during the manufacture of Cu—W alloys, the present inventors discovered that the pore diameter of a porous tungsten body being 0.3 μm or more at a specific cumulative surface area of 95%—that is, pores whose diameter is under 0.3 μm being 5% or less—facilitates infiltrating the porous tungsten body with molten copper, and that compared with the conventional, the occurrence of infiltration left unfinished is markedly reduced.

In addition, because the pore diameter of a porous tungsten body being 0.3 μm or more at a specific cumulative surface area of 95% facilitates copper infiltration, even with an iron-family metal content of 0.02 weight % or less, copper infiltration can be carried out without any problems. This as a result enables drastically reducing the additive amount of iron-family metal, such as iron, nickel or cobalt—which while having been crucial to improving the wettability of tungsten and copper in order to carry out infiltration with ease, has been the source of deterioration in thermal conductivity.

The pore diameter of a porous tungsten body more preferably being 0.5 μm or more at a specific cumulative surface area of 95% totally eliminates the need to add iron-family metal, and merely with iron-family metal contained as impurity within the tungsten powder, and iron-family metal unavoidably admixed in the course of mixing, even if the iron-family metal is 0.002 weight % or less as specific content complete, without any remaining-to-be-infiltrated, copper infiltration is possible.

A porous-tungsten-body pore diameter of 30 µm or more at a specific cumulative surface area of 5%—that is, pores whose diameter exceeds 30 µm being 95% or more—is undesirable because otherwise the capillary action from the pores decreases, making copper infiltration impossible to carry out smoothly, and moreover the strength of the porous tungsten body is weakened, making breakage more liable to occur.

An average grain size of 5 to 20 µm in the abovementioned porous tungsten bodies is preferable, furthermore; 10 to 20 µm is more preferable. Having the grain size within this range makes the powder flow better and makes the density during molding uniform, which keeps deformation during sintering in check. Furthermore, because this allows the density of the molded object to be raised even at low molding pressures, shrinkage due to sintering in order to obtain the density an alloy requires will be minimal, consequently curbing deformation during sintering.

Because its iron-family metal content may be lessened, a first such semiconductor heat-dissipating substrate made from a Cu—W alloy in the present invention is endowed with superior thermal conductivity compared with what is conventional. For example, whereas the thermal conductivity of a conventional W-11 wt. % Cu alloy (approx. 0.2% Ni content) whose thermal expansion coefficient matches that of alumina has been approximately some 180 W/m·K, with a Cu—W alloy in the present invention, a thermal conductivity of 210 W/m·K or more is obtainable when the tungsten is 91 to 75 wt. %, and further, 230 W/m·K or more when the tungsten is 81 to 75 wt. %.

The foregoing first semiconductor heat-dissipating substrate made from a Cu—W alloy in the present invention may be manufactured using ordinary infiltration methods. Specifically, a porous tungsten body is formed by: mixing tungsten powder and an organic binder, and further, iron-family metal as an additive metal powder according to need; pressure-molding this granulated powder within a mold to form a molded object; subsequently heating the molded object to eliminate the organic binder; and carrying out intermediate sintering further as needed. A copper-tungsten alloy in substrate form is thereafter obtained by heating and melting an amount of copper sufficient to fill the pores of the porous tungsten body, infiltrating the copper into the pores within the porous body under agency of the capillary phenomenon and solidifying it in that state. By thereafter processing this into the required form and shot blasting or barrel polishing it to remove excess copper, a semiconductor heat-dissipating substrate is obtained.

Rendering the amount of fine powder and coarse powder to be at or below a standard is effective for controlling the pore diameter of the porous tungsten body to be within the given specifications noted above. Specifically, rendering the amount of powder 0.5 µm or less in particle diameter contained in the tungsten powder employed as a raw material to be 5% or less, and moreover the amount of powder 50 µm or less in particle diameter to be 5% or less, makes for producing a porous tungsten body whose pore diameter at a specific cumulative surface area of 95% is 0.3 µm or more, and moreover whose pore diameter at a specific cumulative surface area of 5% is 30 µm or less. Rendering the amount of powder 3 µm or less in particle diameter to be 5% or less is furthermore desirable in order that the porous-tungsten-body pore diameter at a specific cumulative surface area of 95% be 0.5 µm or more.

Here, in order to enhance the thermal conductivity, impurities apart from the copper and tungsten must be curbed to the extent possible. It is therefore necessary to select a raw material powder in which the amount of impurities is slight to the utmost; in particular, using a high-purity tungsten powder whose impurity content is 0.002 weight % or less is desirable. The mixing-in of impurities during mixing and granulation process steps must of course be kept in check to the extent possible. And likewise with the organic binder: being that carrying out a heating process sufficient for its removal is a matter of course—inasmuch as carbon-containing impurities also lower thermal conductivity, and prove to be a source of warpage as well—it is desirable to have the additive amount of organic binder beforehand be 0.2 weight % or less with respect to the amount of tungsten powder.

Should the thermal conductivity of a Cu—W alloy having the foregoing singular makeup be inadequate, compositing with another material such as copper will prove necessary. In that regard, a second semiconductor heat-dissipating substrate that the present invention provides is composed of a middle portion for carrying semiconductors and a portion peripheral to that, which are of differing materials—the peripheral portion being made of a Cu—W alloy and the middle portion being made of either copper or a material that contains more copper than does the peripheral portion—and is formed unitarily, without a brazing substance such as a brazing layer intervening between the middle portion and the peripheral portion.

Among materials for composing the middle portion and materials for composing the outer portion of a second semiconductor heat-dissipating substrate having such a composition, materials may be selected in a combination so as to differ respectively in thermal conductivity and/or thermal expansion coefficient. By for example composing the middle portion of either copper or a Cu—W alloy that contains ample copper, or otherwise another material, a thermal conductivity of 250 W/m·K or more may be obtained. At the same time, by adjusting the thermal expansion coefficient of the peripheral portion the thermal expansion coefficient of the second semiconductor heat-dissipating substrate can be made to coincide with that of a seal ring made of alumina. At the same time this prevents incidents of warpage due to incompatibility in thermal expansion coefficient with the material that is brazed, it accordingly makes for building packages whose heat dissipativity is extremely high.

In semiconductor devices that can handle the increasingly heightened-output power devices, especially, it is preferable that the copper quantity in the semiconductor-carrying middle portion of the foregoing second semiconductor heat-dissipating substrate having superior heat dissipativity be 30 weight % or more. This consequently yields a substrate whose thermal conductivity in the middle portion is 230 W/m·K or more, more preferably, 250 W/m·K or more. It will be understood that the copper quantity in the peripheral portion in this case would be less than 30 weight %.

Semiconductor devices generally have a structure in which surrounding mechanical devices made of Fe—Ni alloy and Fe—Ni—Co alloy are brazed on. In many situations alumina is used for the surrounding mechanical devices; and alumina, having a thermal expansion coefficient of $6.5 \times 10^{-6}/°$ C., matches a Cu—W alloy in which the Cu is 11 weight %, which makes for curbing post-brazing warpage to the utmost. If the Cu quantity in the middle portion that carries semiconductors is made 30 or more weight %, because its thermal expansion coefficient will be larger than that of alumina, significant post-brazing warpage will end up occurring.

In this respect, in a second semiconductor heat-dissipating substrate in the present invention, by rendering the peripheral portion onto which the surrounding mechanical devices of alumina are brazed a Cu—W alloy in which the amount of Cu—which has a smaller thermal expansion coefficient than that of alumina—is 10 weight % or less, the thermal expansion coefficient of the semiconductor heat-dissipating substrate will be matched in its entirety with alumina, to make for preventing warpage. Warpage does occur with Fe—Ni alloy and Fe—Ni—Co alloy although not as pronounced as with alumina, because their thermal expansion coefficients are small, being 8 to $9 \times 10^{-6}/°$ C. Given that, utilizing a Cu—W alloy in which the Cu quantity is 15 weight % or less as the peripheral portion to which Fe—Ni alloy or Fe—Ni—Co alloy is brazed makes it possible to curb warpage to the utmost.

In particular, by coordinating the compatibilities, warpage in the semiconductor heat-dissipating substrate can be curbed to 1 $\mu$m or less per millimeter even in the longitudinal direction. Because warpage in the protruding direction lifting the surrounding mechanical devices is caused by the thermal expansion coefficient of the heat-dissipating substrate being large, reducing the amount of Cu in the peripheral portion of the heat-dissipating substrate to make the heat-dissipating-substrate thermal expansion coefficient smaller makes for lessening the warpage. Utilizing the foregoing technique also enables controlling the warpage direction to be in the direction in which the central portion is earthed, which is very efficacious in enhancing heat dissipativity.

It should be understood that a semiconductor heat-dissipating substrate from a Cu—W alloy must be Ni-plated before brazing. Afterwards, in order to fortify the adhesive strength, it is desirable to carry out a heat treatment, at 750° C. or more, in which the Ni diffuses into the Cu that is a constituent of the Cu—W alloy. Warpage following the heat-treatment at a 750° C. or greater temperature must nonetheless be held in down to 1 $\mu$m or less per millimeter. Because warpage when heating arises due, apart from irregularities in density, to residual stress during sintering, it is desirable to slow the post-infiltration cooling speed and to preheat the alloy at a temperature of 750° C. or more before processing, to eliminate the stress.

In addition, the second semiconductor heat-dissipating substrate may be utilized without the peripheral side-face going through machining or polishing process steps, and the dimensional accuracy may be set within ±2 $\mu$m per millimeter, more preferably within ±1 $\mu$m per millimeter.

A method of manufacturing a second semiconductor heat-dissipating substrate that the present invention provides integrates two kinds of Cu—W alloys, or copper and a Cu—W alloy, in the process of manufacturing a Cu—W alloy based on the way of infiltrating described earlier, and enables manufacturing at low cost semiconductor heat-dissipating substrates whose thermal conductivity is high, and that excel in heat dissipativity.

Figure 1B:
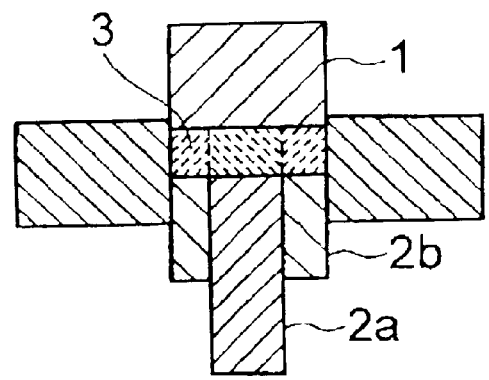
Figure 1C:
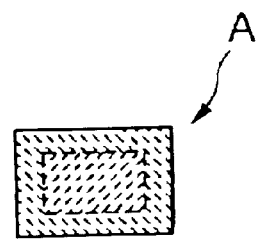
Figure 2A:
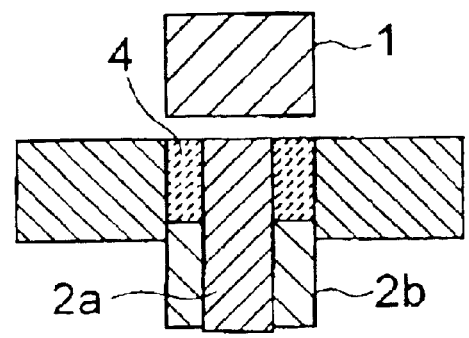
FIG. 2 is an explanatory diagram illustrating another specific example, under the present invention, of a method of manufacturing a molding form utilized in fabricating a semiconductor heat-dissipating substrate composed of a central portion and a peripheral portion that differ in material properties.
Figure 2B:
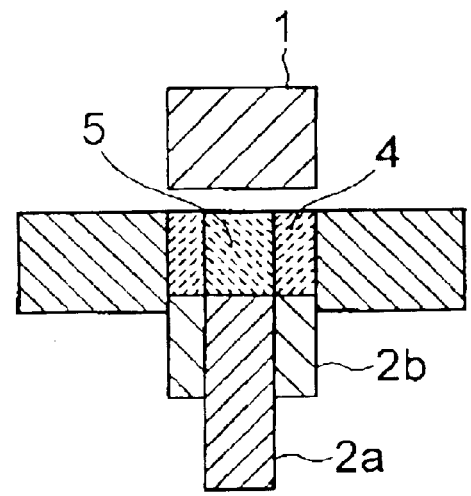
Figure 2C:
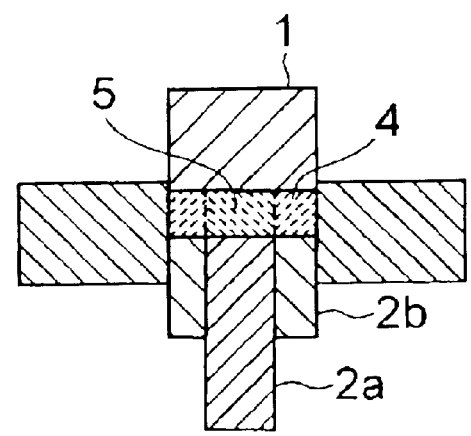
Figure 2D:
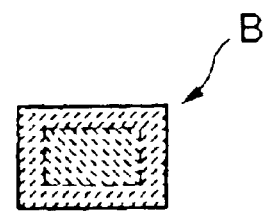
Figure 3A:
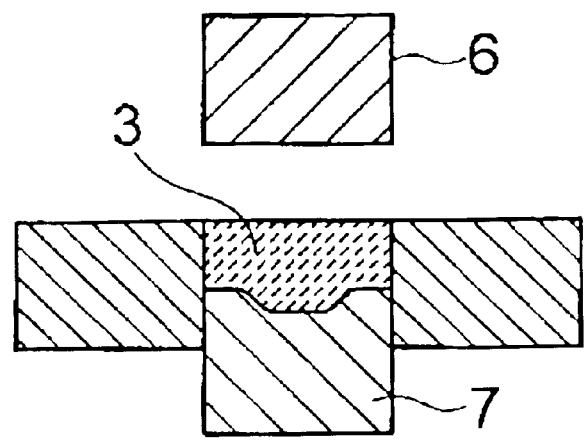
FIG. 3 is an explanatory diagram illustrating a separate specific example, under the present invention, of a method of manufacturing a molding form utilized in fabricating a semiconductor heat-dissipating substrate composed of a central portion and a peripheral portion that differ in material properties.
Figure 3B:
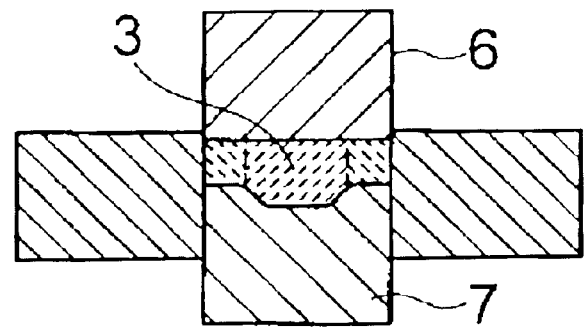
Figure 3C:
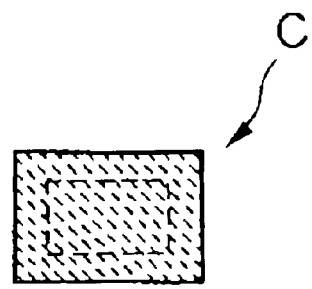
Figure 4A:
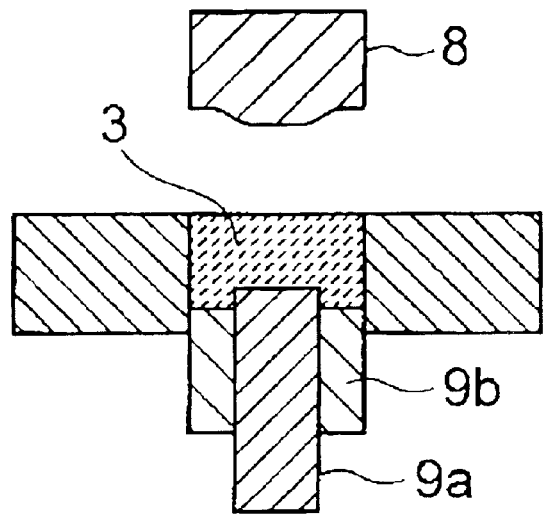
FIG. 4 is an explanatory diagram illustrating a further separate specific example, under the present invention, of a method of manufacturing a molding form utilized in fabricating a semiconductor heat-dissipating substrate composed of a central portion and a peripheral portion that differ in material properties.
Figure 4B:
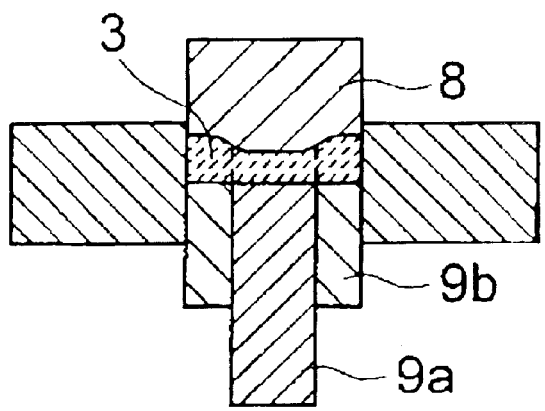
Figure 4C:
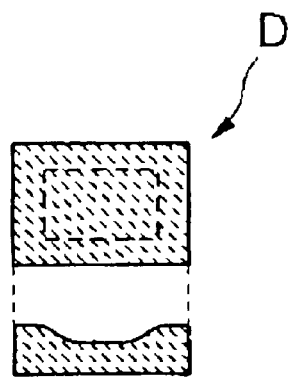

Among methods of manufacturing such a second semiconductor heat-dissipating substrate, a first method as for example indicated schematically in FIGS. 1 and 3 or 4 produces a density difference between the middle portion and the peripheral portion, i.e., a molded object in which the quantities of vesicles differ, by charging the interior of a mold with raw-material tungsten powder and when pressure-molding employing a multi-shaft press imparting a pressure difference between the middle portion and the peripheral portion. Subsequently infiltrating this porous body with copper makes for yielding a semiconductor heat-dissipating substrate in which two kinds of Cu—W alloys are combined, without undergoing a brazing or like bonding process.

Likewise, by a second method as for example indicated in FIG. 2, a molded object in which the compositions of the middle portion and the peripheral portion differ is manufactured by utilizing a multi-shaft press to alter the raw-material powder in the middle portion and peripheral portion—specifically, to alter the proportions of tungsten powder and additive metal powder—and subsequently the porous body is infiltrated with copper. With the foregoing first method in which the vesicle quantities are altered by means of a pressure difference during pressure-molding, too great a pressure difference becomes a source of cracking; but with the second method in which the compositions of the raw-material powders are altered, a semiconductor heat-dissipating substrate in which Cu—W alloys of two kinds that differ in composition may be obtained without altering the quantities of vesicles.

Figure 5A:
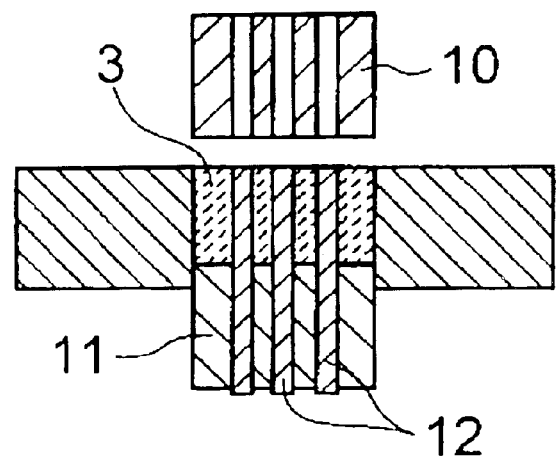
FIG. 5 is an explanatory diagram illustrating a still further specific example, under the present invention, of a method of manufacturing a molding form utilized in fabricating a semiconductor heat-dissipating substrate composed of a central portion and a peripheral portion that differ in material properties.
Figure 5B:
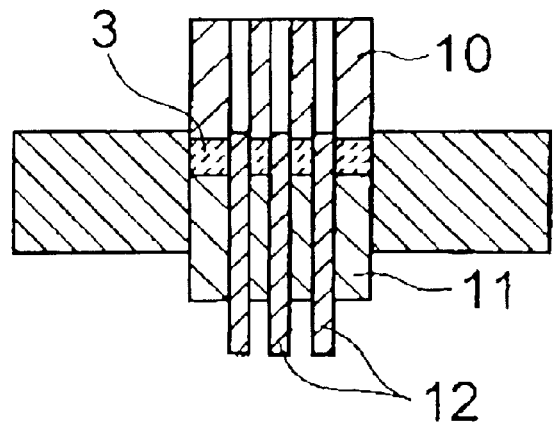
Figure 5C:
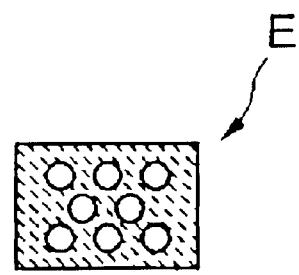

In furthermore a third method, as for example illustrated in FIG. 5, a recess and numerous perforating or non-perforating small holes are formed in pressure-molding tungsten powder, and copper is charged into the recess and numerous small holes at the same time copper is infiltrated into the porous body. Further, in a fourth method, as for example illustrated in FIG. 6, a porous tungsten body is produced, in the middle portion of which a through-hole is formed either when pressure-molding the tungsten powder or by thereafter punching or the like, and after pressure-introducing copper chips into the through-hole and copper-infiltrating the porous body, the entirety is heat-treated. Semiconductor heat-dissipating substrates in which a Cu—W alloy and copper are combined can be obtained through these methods.

Nevertheless, to realize the small warpage that the present invention makes a feature, the section in which Cu in the middle portion is amply contained and the dimensions of the peripheral portion must be done according to design. It is therefore desirable to establish the position of the middle portion in the mold, and then to utilize the peripheral portion without putting it through processing stages such as machining or polishing. In order to do so, deformation during intermediate sintering and copper infiltration must be suppressed. In order that sintering proceed uniformly, holding iron-group impurities, which become a cause of deformation, down to 0.02 weight % or less is desirable. This is desirable due to the fact that inasmuch as iron-group impurities also turn out to be a source of thermal conductivity degradation, by adjusting the amount to be 0.02 weight % or less, reduction in thermal conductivity can be curbed.

Also desirable is to have the mean particle diameter of the tungsten be 5 to 20 $\mu$m. Rendering this range of particles uniformizes the density during molding because the powder flow becomes better and makes it possible to hold deformation during sintering in check. Moreover, the fact that the density in molding can be raised compared with a case in which the mean particle diameter is 5 $\mu$m or less minimizes shrinkage that is due to sintering in order to obtain the required density, and consequently enables restraint of deformation during sintering. By keeping the dimensional accuracy of the peripheral portion to ±2 $\mu$m or less per millimeter, the semiconductor heat-dissipating substrate can be utilized as it is, without processing the peripheral side-face.

Thus, with the first and second semiconductor heat-dissipating substrates according to the present invention, by rendering the semiconductor-carrying middle portion to have a high thermal conductivity, heat issuing from the semiconductors may be effectively eliminated. At the same time, furthermore, rendering the peripheral portion to have a low thermal expansion coefficient makes it possible to hold expansion of the higher-thermal-conductivity middle portion in check.

In the majority of cases the foregoing first and second semiconductor heat-dissipating substrates of the present invention have seal rings and electrode terminals made of a ceramic such as alumina and beryllia, or of a Fe—Ni alloy or Fe—Ni—Co alloy brazed onto them, wherein they are utilized as packages. Post-brazing warpage in these packages can be held down to 1 $\mu$m per millimeter length, and owing to their excellent thermal conductivity they are superior in heat dissipativity as well.

In a semiconductor device in which semiconductor circuit elements are carried on such a package, because the substrate middle portion directly beneath the semiconductor elements has high thermal conductivity and because warpage in the substrate is small, adherence with the semiconductor elements is high, and the device excels exceedingly in heat dissipativity. In particular, the peripheral portion, and the middle portion that carries semiconductor circuit elements, of the semiconductor heat-dissipating substrate are composed of materials that differ, with the amount of Cu in the middle portion being 0.30 weight % or more; and preferably the amount of Cu in the peripheral portion directly beneath the surrounding mechanical devices is 10 weight % or less, and preferably the surrounding mechanical devices are made of alumina.

Furthermore, a submount furnished with a solder layer on the optical-semiconductor-element-carrying principal face of a submount substrate may be produced utilizing the foregoing first and second semiconductor heat-dissipating substrates as the submount substrates. Likewise, furnishing a solder layer on the reverse face on the side opposite the principal face that carries optical semiconductor elements makes it so that a stem can be joined on.

The surface roughness of the submount substrate is preferably 1 $\mu$m or less in $R_a$, more preferably 0.1 $\mu$m or less in $R_a$. Likewise, the flatness of the submount substrate is preferably 5 $\mu$m of less, more preferably 1 $\mu$m or less. If the surface roughness $R_a$ surpasses 1 $\mu$m, or the flatness surpasses 5 $\mu$m, gaps between the submount and elements will at times arise when connecting in place optical semiconductor elements such as laser diodes, and the element-cooling effectiveness will deteriorate. Here, the surface roughness $R_a$ and the flatness are prescribed by JIS specifications (JISB0601 and JISB0621, respectively).

In addition, it is preferable that as shown in FIG. 7 the dimension C of a chamfer on the edge portion of the principal face, which carries an optical semiconductor element, of a submount substrate 20 for a submount is 30 $\mu$m or less, more preferably 10 $\mu$m or less, most preferably 5 $\mu$m. Since in this case the submount substrate 20 adheres all the way to the edge portion of the optical semiconductor element, there is a sufficiently endothermic effect through the element edge portion also. Here, the chamfer dimension C is prescribed by JIS (Japan Industrial Standard) B0001 and B0701.

Figure 7A:
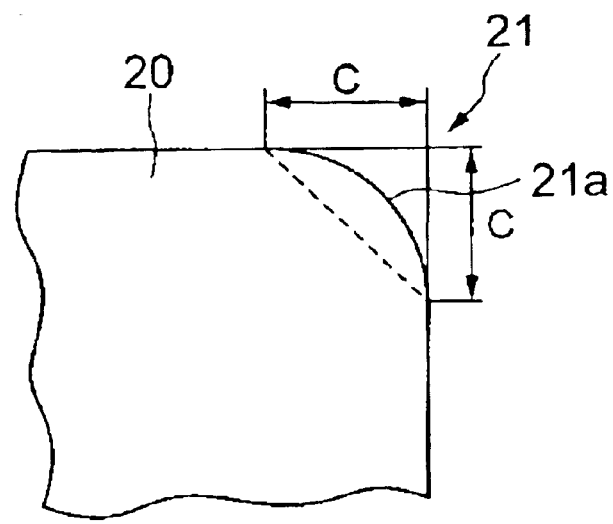
FIG. 7 is a schematic plan view depicting a chamfered portion of a submount substrate; wherein (a) illustrates a portion chamfered by grinding, (b) a portion chamfered by polishing, and (c) a spontaneously generated chamfered portion jagged in form.

Specifically, a chamfer 21a is formed on the edge portion 21 of the principal face, as in FIG. 7(a). The dashed line in FIG. 7(a) indicates a situation in which the chamfer dimension C is 30 $\mu$m; and in the present invention, the chamfer portion 21a preferably does not go beyond the dashed line.

Figure 7B:
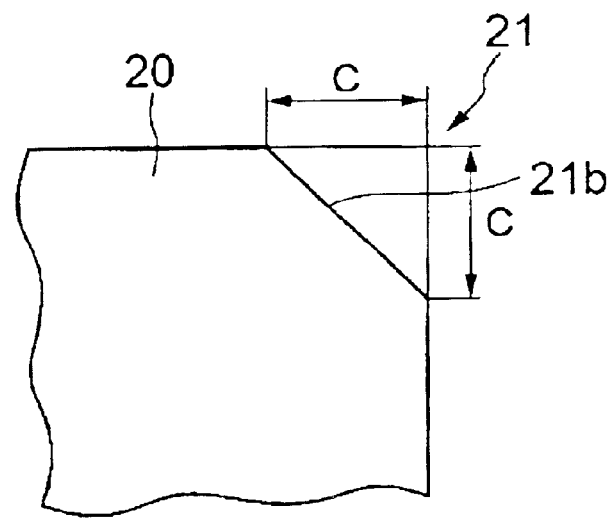
Figure 7C:
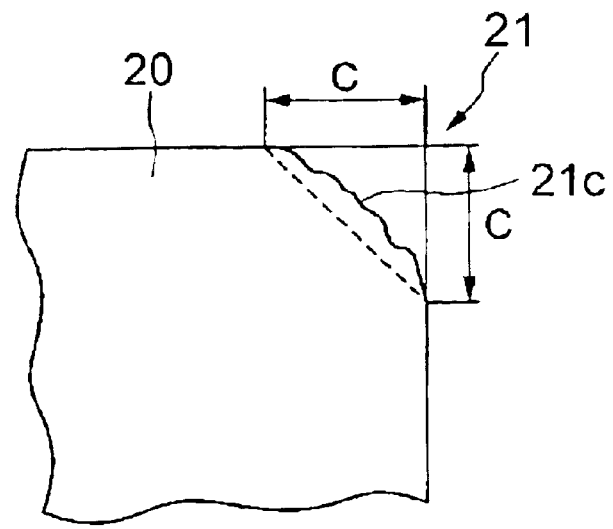

The form of the chamfer on the edge portion 21, furthermore, may be produced artificially through grinding as is chamfer 21a in FIG. 7(a), or by polishing like chamfer 21b in FIG. 7(b); or else the edge portion 21 being chipped into a naturally arising jagged form as is chamfer 21c depicted in FIG. 7(c) will also suit. It will also suit that there is essentially no chamfer portion.

On the surface of the submount substrate, in order to make secure the joint between the submount and the optical semiconductor element as well as the stem an adhesive layer can be provided directly in contact with the surface. The adhesive-layer material may be, to name examples, a material whose bonding affinity with the substrate is satisfactory, and if formed by plating, may be Ni, Ni—Cr, Ni—P, Ni—B, Ni—Co or nickel sulfamate. Likewise, if formed by vapor deposition, the adhesive layer may be Ti, V, Cr, Ni, NiCr alloy, Zr, Nb, or Ta, to name examples. The adhesive layer is preferably 0.01 to 10 $\mu$m, more preferably 1 to 10 $\mu$m in thickness.

Furthermore, an ordinary plating method such as electroless plating, electroplating, or vibratory barrel plating, or an ordinary vapor deposition method such as vacuum vapor deposition or sputtering, can be utilized as a method of forming the adhesive layer. The adhesive layer after it has been formed by plating or vapor deposition is preferably sintering-treated at 500 to 600° C. under a hydrogen atmosphere, in order to enhance the adhesive strength between the adhesive layer and the submount.

An anti-dispersion layer can be provided on top of the adhesive layer, with a solder layer on top of the anti-dispersion layer. Examples that can be given of the substantive material for the anti-dispersion layer include Pt, Au, Pd, Ag and Mo; and a plurality of layer such as Pt/Au may be laminated. Any sort of layer-deposition method, such as vapor-deposition or plating may be employed as a method of forming the anti-dispersion layer; but it is preferable to use sputtering, inasmuch as when a layer is deposited on the principal and reverse faces, layers are also deposited on the side faces. The anti-dispersion layer thickness is preferably 0.01 to 10 $\mu$m, more preferably 0.05 to 1.5 $\mu$m.

A low-melting-point metal solder such as In or Sn, or an AuSn—, AgSn—, AuGe—, PbSn— or InSn-alloy solder, or a solder in which these are combined can be utilized as the solder-layer material for joining the optical semiconductor element and the stem to the submount. Likewise, for the form given the solder layer before it is melted a laminate of metals of individual kinds comprising the above-mentioned alloy solders can be utilized. Here, if an AgSn solder is utilized for the solder layer, the Ag composition percentage is preferably 72 weight % or less. Likewise, for an AuSn solder, 65 to 85 weight % or 5 to 20 weight % Au percentage in the composition is preferable. Methods that have been conventionally used—vapor deposition, sputtering, or plating for example—can be employed as methods for forming the solder layer.

Figure 8:
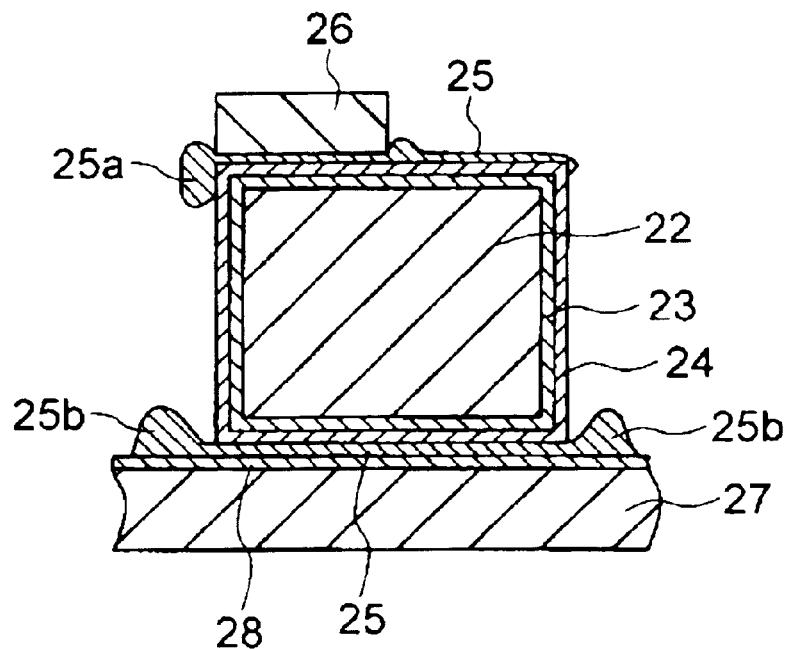
FIG. 8 is a schematic sectional view illustrating an optical semiconductor element and a stem being carried on a conventional submount.

In instances of joining an optical semiconductor element or the like to the submount, as shown for example in FIG. 8, a solder layer 25 is effected on the principal and reverse faces of a submount substrate 22, on which a Ni layer 23 that is an adhesive layer and a Pt layer 24 that is an anti-dispersion layer have been superficially provided; and wherein on the principal face an optical semiconductor element 26, and on the reverse face a stem 27, are joined at the same time, when the solder connection is made, at for example 330° C. or so, the melted solder flows out from between the principal face and the optical semiconductor element 26, and bulges into a blob; and this bulging portion 25a has sometimes interfered with the emission of light by the bottom-emitting optical semiconductor element 26. Sometimes solder likewise has flowed out from between the reverse face and the stem 27, forming a bulging portion 25b in a blob.

In a submount of the present invention a solder layer is furnished on the principal face that is to carry an optical semiconductor element; meanwhile on at least one side face preferably, and more preferably on all the side faces, a solder layer is formed continuously from the solder layer on the principal face. A stem-joining solder layer is also formed along the reverse face of the submount on the side opposite the principal face. As a thickness of the solder layer on the semiconductor-element-carrying principal face and the stem-joining reverse face, 0.1 to 10 μm is preferable, while on the side faces 0.1 to 2 or so μm is preferable.

Figure 9:
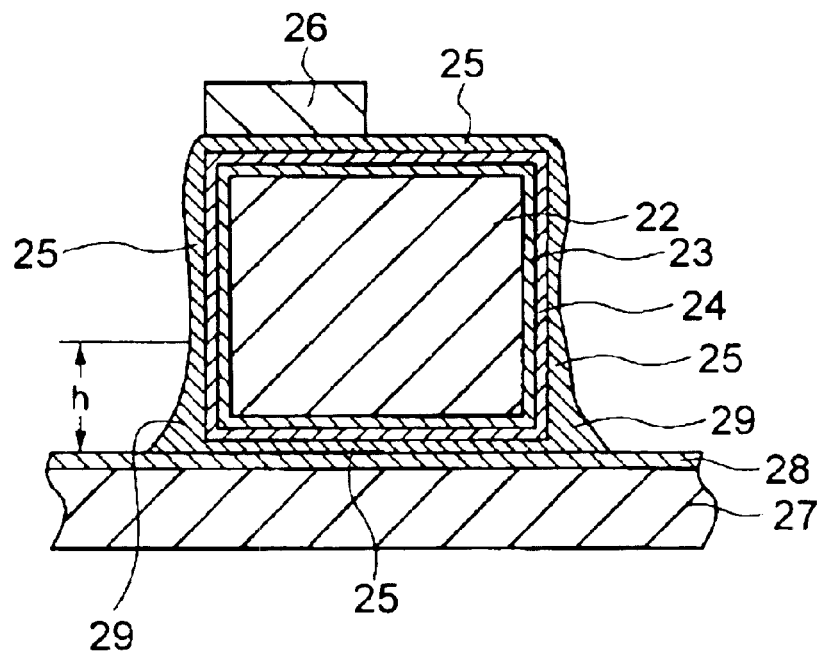
FIG. 9 is a schematic sectional view illustrating an optical semiconductor element and a stem being carried on a submount in the present invention.

Owing to the fact that in this case, as in illustrated in FIG. 9, the solder layer 25 is provided on not just the principal and reverse faces, but also on all the side faces, solder having flowed out from between the principal face and the optical semiconductor element 26 when the optical semiconductor element 26 and the stem 27 are joined can flow passing downward along the solder layer 25 on the side faces, and together with solder having flowed out from between the reverse face and the stem 27, bulges atop the stem 27 and forms a meniscus 29 on the four side faces together. This is true not only in cases in which the optical semiconductor element 26 and the stem 27 are joined on simultaneously, but also in cases in which they are joined on sequentially one after the other.

Accordingly, due to the smooth flow of the solder and to the formation of the meniscus 29, bulges of solder that would interfere with the emission of light from the optical semiconductor element 26 do not form, and moreover excellent joint strength between the submount substrate 22, and the optical semiconductor element 26 and the stem 27, is obtained. Providing the solder layer 25 at least on the one submount side face that is line with the light-emitting face of the optical semiconductor element 26 makes possible curbing the formation of a solder bulge that would be a hindrance to the emission of light. Further, in order to heighten the joint strength, 0.01 to 0.2 mm or so is preferable, and 0.03 to 0.2 mm or so is more preferable, for the height (meniscus dimension) h of the meniscus 29 that forms over the stem 27 in between it and the submount side faces.

In a situation in which the optical semiconductor element and the stem are mounted/joined onto the submount at the same time, forming solder layers of an identical kind on all six faces of the submount is desirable. Moreover, after the optical semiconductor element has been joined on through the solder layer provided on principal face of the submount, the stem can be joined onto the reverse face utilizing a preform of solder whose melting point is lower. Conversely also, after the stem has been joined on, the optical semiconductor element may be mounted in place. In addition, it is possible to connect the optical semiconductor element and the stem in place utilizing solder preforms whose melting point is on the same order.

The optical semiconductor element may be, as representative examples, a laser diode or a light-emitting diode. The semiconductor substance may be, for example, a semiconductor compound from the III–V family, such as GaAs or InP, or may be a GaN-type semiconductor. Likewise, the optical semiconductor element may be either a top-emitting type or a bottom-emitting type. It will be understood that if a bottom-emitting type of semiconductor device (of the class in which the light-emitting portion is formed along the laser-diode side that opposes where the laser diode and the solder layer join) is used as a laser diode, the heat dissipativity can be more enhanced, since the light-emitting portion—which is a heat-emitting portion—will be disposed in a position the nearer to the substrate. An insulating layer of SiO or the like, and an electrode 2 layer of Au or the like, are formed on the surface of the optical semiconductor element. It is preferable that the thickness of Au as an electrode layer be 0.1 to 10 μm or so, in order to secure adequate wettability with the solder layer.

Metals or ceramics, for example, can be utilized as materials for the stem. Cu, Al, W, Mo, Fe, Ni, and alloys and composite substances containing these metals can be utilized as the metal. Fe—Ni and Ni—Fe—Co are examples that may be given of such alloys; and Cu—W or the like is an example that may be given of such composite substances—which may be, furthermore, Cu—W derived from the present invention. Here it is preferable that a Ni or Au thin film, or a thin film containing these metals, be formed superficially on the stem. These films can be formed by vapor deposition or plating. The thermal conductivity of the stem is preferably 100 W/m·K or more, and more preferably 200 W/m·K or more.

A semiconductor device of the present invention, being an optical semiconductor element carried on a submount, and on the side opposite thereto a stem joined onto the reverse face, has a superior heat dissipativity that can handle the increasingly heightened-output power devices.

Embodiment 1

The 8 types of tungsten powder containing the particle diameter distributions and iron-family impurities set forth in Table I were readied. Particle diameter distribution in the powders here was measured using a laser interferometer system for gauging particle-diameter-distribution. The tungsten powder was introduced into a stirring mixer, and an acrylic organic binder was added at 0.1 weight % with respect to the tungsten powder, which was then mixed 1 hour using alcohol as a mixing medium, whereby secondary particles approximately 85 μm in particle diameter were granulated. The amount of iron-family metal in the impurities contained in each of the obtained granulated powders was ascertained; admixing in the course of the mixing procedure was nonexistent, however, with there being no change from when the mixing was first begun.

TABLE I

| W powder no. | Particle diameter distribution (μm) | | | Iron-family impurities (wt %) | | |
|---|---|---|---|---|---|---|
| | 5% | 50% | 95% | Fe | Ni | Co |
| 1 | 0.22 | 1.1 | 1.7 | 0.0008 | 0.0003 | 0.0001 |
| 2 | 0.92 | 3.3 | 8.3 | 0.0006 | 0.0001 | 0.0002 |
| 3 | 1.2 | 5.8 | 9.1 | 0.0007 | 0.0003 | 0.0002 |
| 4 | 2.4 | 8.3 | 11.7 | 0.0007 | 0.0003 | 0.0001 |
| 5 | 3.4 | 11.6 | 16.4 | 0.0009 | 0.0002 | 0.0002 |
| 6 | 6.4 | 22.3 | 31.5 | 0.0007 | 0.0003 | 0.0002 |
| 7 | 8.8 | 30.5 | 43.0 | 0.0006 | 0.0001 | 0.0001 |
| 8 | 11.2 | 38.8 | 54.8 | 0.0008 | 0.0001 | 0.0002 |

(Note: 5%, 50% and 95% in the "Grain size distribution" column in the table indicate cumulative weight %.)

Subsequently, the above-noted granulated powders were fabricated into flat plates 30×15×2 mm by pressure-molding them in a powder-molding press. The organic binder was eliminated from these molded objects by heating them in a hydrogen gas stream 1 hour at 400° C., followed by 1 hour at 900° C. Intermediate sintering was thereafter carried out in a hydrogen gas stream at 1300° C., yielding respective porous tungsten bodies. The pore-diameter distribution of the obtained porous tungsten bodies was measured employing a mercury porosimeter. It is to be noted that chipping in the edge portion of the porous tungsten body for which powder No. 8 in Table I was utilized, which contained at least 5% pores of 30 μm or more diameter, did occur during handing.

Next, copper sheet sufficient to fill the volume of vesicles in the porous tungsten bodies was prepared, the porous tungsten bodies were set onto the copper sheet and, melting the copper by heating at 1200° C. in a hydrogen gas stream, copper infiltration was carried out to produce Cu—W alloys. The incidence of copper infiltration left unfinished in this case was found and is indicated in Table II below together with the pore-diameter distribution of the porous tungsten bodies, which had been measured earlier.

TABLE II

| W powder no. | W porous body pore-diameter distribution (μm) | | | Incidence of unfinished infiltration (%) |
|---|---|---|---|---|
| | 5% | 50% | 95% | |
| 1* | 0.99 | 0.54 | 0.29 | 82 |
| 2 | 1.2 | 0.63 | 0.33 | 12 |
| 3 | 1.8 | 0.82 | 0.39 | 8 |
| 4 | 2.0 | 0.98 | 0.43 | 6 |
| 5 | 2.8 | 1.2 | 0.55 | 0 |
| 6 | 9.1 | 2.8 | 0.85 | 0 |
| 7 | 28.4 | 6.5 | 1.45 | 0 |
| 8* | 90.4 | 15.2 | 2.51 | 0 |

(Note: Samples marked with "*" in the table are comparative examples. Furthermore, 5%, 50% and 95% in the "W porous body pore-diameter distribution" column in the table indicate specific cumulative surface area.)

As is evident from Table II, there were no incidents of unfinished infiltration in any of the samples, under the present invention, of porous tungsten bodies whose pore diameter at a specific cumulative surface area of 95% was 0.5 μm or more, and Whose pore diameter at 5% was 30 μm or less (W Powder Nos. 5 through 7); and the incidence of unfinished infiltration in the samples whose pore diameter at a specific cumulative surface area of 95% was 0.3 μm (W Powder Nos. 2 through 4) was drastically decreased.

From these results it is evident that rendering the pore diameter at a specific cumulative surface area of 95% to be 0.3 μm or more, and the pore diameter at 5% to be 30 μm or less, enhances productivity by reducing the occurrence of unfinished infiltration, and at the same time achieves sufficient copper infiltration by eliminating occurrences of unfinished infiltration, even without employing the iron-family metal added conventionally in order to enhance wettability.

Embodiment 2

Iron powder and nickel powder of 1 μm average particle diameter, as iron-family metals, and as necessary, copper powder of 5 μm average particle diameter, were added to tungsten powders being W Powder Nos. 2 through 7 set forth in the foregoing Table I, in the compositional proportions indicated in the following Table III. Likewise as with Embodiment 1, a stirring mixer was employed to add these powders with an acrylic organic binder; and then by mixing 1 hour using alcohol as a mixing medium, secondary particles approximately 85 μm in particle diameter were granulated. The amount of iron-family metal in the impurities contained in each of the obtained granulated powders was ascertained; admixing in the course of the mixing procedure was nonexistent, however, with there being no change from when the mixing was first begun.

These granulated powders were fabricated into flat plates 30×15×2 mm by molding them in a powder-molding press. The organic binder was eliminated from these molded objects by heating them in a hydrogen gas stream 1 hour at 400° C., followed by 1 hour at 900° C. Thereafter, a portion of the molded objects were then rendered as is, and a portion were rendered by intermediately sintering them in a hydrogen gas stream at the temperatures set forth in Table III below, into respective porous tungsten bodies.

TABLE III

| Sample no. | W powder no. | Additive metal (wt. %) | | | Intermediate sintering temp. (° C.) |
|---|---|---|---|---|---|
| | | Fe | Ni | Cu | |
| 1 | 2 | 0 | 0 | 0 | 1300 |
| 2 | 3 | 0 | 0 | 0 | 1300 |
| 3 | 4 | 0 | 0 | 0 | 1300 |
| 4 | 5 | 0 | 0 | 0 | 1300 |
| 5 | 6 | 0 | 0 | 0 | 1300 |
| 6 | 7 | 0 | 0 | 0 | 1300 |
| 7 | 5 | 0 | 0 | 0 | 1350 |
| 8 | 5 | 0 | 0 | 0 | 1250 |
| 9 | 5 | 0 | 0 | 0 | 1200 |
| 10 | 5 | 0 | 0 | 0 | 1150 |
| 11 | 5 | 0 | 0.005 | 0 | 1300 |
| 12 | 5 | 0 | 0.01 | 0 | 1300 |
| 13 | 5 | 0 | 0.015 | 0 | 1300 |
| 14 | 5 | 0 | 0.02 | 0 | 1250 |
| 15 | 6 | 0 | 0.02 | 0 | 1250 |
| 16 | 7 | 0 | 0.02 | 0 | 1250 |
| 17 | 2 | 0 | 0.02 | 0 | 1250 |
| 18 | 3 | 0 | 0.02 | 0 | 1250 |
| 19 | 4 | 0 | 0.02 | 0 | 1250 |
| 20 | 5 | 0 | 0.1 | 0 | 1200 |
| 21 | 6 | 0 | 0.1 | 0 | 1200 |
| 22 | 7 | 0 | 0.1 | 0 | 1200 |
| 23 | 5 | 0 | 0.1 | 0 | 1200 |
| 24 | 5 | 0 | 0.1 | 0 | 1200 |
| 25 | 5 | 0 | 0.1 | 3 | 1200 |
| 26 | 5 | 0 | 0.1 | 1 | 1300 |
| 27 | 5 | 0 | 0 | 0 | 1300 |
| 28 | 5 | 0 | 0.1 | 0 | 1300 |
| 29 | 5 | 0 | 0 | 10 | 1300 |
| 30 | 5 | 0 | 0 | 15 | 1300 |
| 31 | 5 | 0 | 0 | 25 | 1300 |
| 32 | 5 | 0 | 0 | 35 | 1300 |
| 33 | 5 | 0 | 0 | 0 | — |

Next, copper sheet sufficient to fill the volume of vesicles in the porous tungsten bodies was prepared, the porous tungsten bodies were set onto the copper sheet and, melting the copper by heating them at 1200° C. in a hydrogen gas stream, copper infiltration was carried out to produce Cu—W alloys. The obtained Cu—W alloys were processed to remove excess copper from the surface, and their densities, thermal conductivities, and thermal expansion coefficients were measured; those results together with quantity of copper infiltrated are set forth in Table IV below.

TABLE IV

| Sample | W powder no. | Density (g/cm³) | Cu qty. (wt. %) | Thermal expansion coefficient (ppm/° C.) | Thermal conductivity (W/mK) |
|---|---|---|---|---|---|
| 1 | 2 | 17.0 | 11 | 6.5 | 212 |
| 2 | 3 | 17.0 | 11 | 6.5 | 214 |
| 3 | 4 | 17.0 | 11 | 6.5 | 215 |
| 4 | 5 | 17.0 | 11 | 6.5 | 217 |
| 5 | 6 | 17.0 | 11 | 6.5 | 215 |
| 6 | 7 | 17.0 | 11 | 6.5 | 211 |
| 7 | 5 | 17.7 | 8 | 5.7 | 208 |
| 8 | 5 | 16.4 | 15 | 7.8 | 229 |
| 9 | 5 | 15.6 | 20 | 9.3 | 244 |
| 10 | 5 | 15.0 | 25 | 10.8 | 259 |
| 11 | 2 | 17.0 | 11 | 6.5 | 212 |
| 12 | 3 | 17.0 | 11 | 6.5 | 208 |
| 13 | 4 | 17.0 | 11 | 6.5 | 203 |
| 14 | 5 | 17.0 | 11 | 6.5 | 195 |
| 15 | 6 | 17.0 | 11 | 6.5 | 197 |
| 16 | 7 | 17.0 | 11 | 6.5 | 199 |
| 17 | 2 | 17.0 | 11 | 6.5 | 200 |
| 18 | 3 | 17.0 | 11 | 6.5 | 198 |
| 19 | 4 | 17.0 | 11 | 6.5 | 195 |
| 20 | 5 | 17.0 | 11 | 6.5 | 182 |
| 21 | 6 | 17.0 | 11 | 6.5 | 186 |
| 22 | 7 | 17.0 | 11 | 6.5 | 188 |
| 23 | 5 | 17.0 | 11 | 6.5 | 190 |
| 24 | 5 | 17.0 | 11 | 6.5 | 188 |
| 25 | 5 | 17.0 | 11 | 6.5 | 186 |
| 26 | 5 | 17.0 | 11 | 6.5 | 190 |
| 27 | 5 | 17.0 | 11 | 6.5 | 188 |
| 28 | 5 | 17.0 | 11 | 6.5 | 190 |
| 29 | 5 | 16.4 | 15 | 7.8 | 229 |
| 30 | 5 | 15.6 | 20 | 9.3 | 244 |
| 31 | 5 | 14.1 | 30 | 10.5 | 252 |
| 32 | 5 | 13.2 | 40 | 12.1 | 273 |
| 33 | 5 | 17.0 | 11 | 6.5 | 216 |

As evident from the foregoing Table m and Table IV, the thermal conductivity at a tungsten content of 91 weight % or less can be raised to 200 W/m·K or more by having the additive amount of iron-family metal be less than 0.02 weight %; to 210 W/m·K or more by having the additive amount be less than 0.01 weight %; and still further (to 217 W/m·K with Sample 4 for example) by having the elemental additive amount be zero and the content of iron-family metal be less than 0.002 weight %. Likewise, the thermal conductivity with the tungsten content being 81 weight % or less can be rendered 230 W/m·K or more by having the additive amount of iron-family metal be less than 0.02 weight %.

Embodiment 3

Semiconductor heat-dissipating substrates comprising a semiconductor-element-carrying central portion and a portion peripheral thereto that differ in substantive material were fabricated. In this case, molded objects were fabricated by the below-presented methods (1) through (6) in pressure-molding procedures.

(1) As indicated in FIG. 1, an NC multi-shaft press, in which against an upper punch 1 lower punches 2a and 2b operate separately in central and peripheral sections, was employed; and with the central-portion lower punch 2a being pushed up somewhat as in (a) the press was charged with a W powder 3, being Powder No. 5 in above-noted Table I; then by pressing the W powder 3 in the press as in (b) to vary the compression in the central and peripheral portions, a molded object A as in (c), whose density—i.e., vesicle quantity—in the central and peripheral portions differs, was produced.

(2) As indicated in FIG. 2, the NC multi-shaft press, in which against the upper punch 1 the lower punches 2a and 2b operate separately in central and peripheral sections, was likewise employed; and (a) at first with the central-portion lower punch 2a being raised, the peripheral portion was charged with a powder 4 mixed according to Sample 26 in foregoing Table III; next as in (b), the central-portion lower punch 2a was lowered, and the cavity formed in the central portion was charged with a powder 5 mixed according to Sample 27 in foregoing Table III; and by thereafter pressing in the press as in (c), a molded object B as in (d), whose powder composition in the central and peripheral portions differs, was produced.

(3) As indicated in FIG. 3, an NC multi-shaft press having, for an upper punch 6 a recessed lower punch 7, was employed; and as in (a) the press was charged with a W powder 3, being Powder No. 5 in above-noted Table I; then by pressing the W powder 3 in the press, varying the compression continuously in the central and peripheral portions as in (b), a molded object C as in (c), whose density—i.e., vesicle quantity—in the central and peripheral portions differs, was produced.

(4) As indicated in FIG. 4, an NC multi-shaft press, in which operate a bulged upper punch 8 and, separately in central and peripheral sections, lower punches 9a and 9b, was employed; and with the central-portion lower punch 9a being pushed up somewhat as in (a) the press was charged with a W powder 3, being Powder No. 5 in above-noted Table I; then by pressing the W powder 3 in the press as in (b) to vary the compression in the central and peripheral portions, a molded object D as in (c), whose middle has a recess and whose density—i.e., vesicle quantity—in the central and peripheral portions differs, was produced.

(5) As indicated in FIG. 5, an NC press, furnished with a plurality of perforations in an upper punch 10 and a lower punch 11, and in which core pins 12 of the same diameter as the perforations are stood, was employed; and as in (a) the press was charged with a W powder 3, being Powder No. 5 in above-noted Table I; then by press-working as in (b), a molded object E as in (c), having in its central portion a plurality of perforations corresponding to the locations of the core pins 12, was fabricated.

Figure 6A:
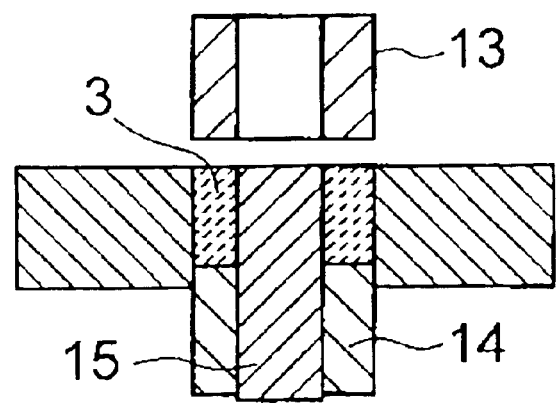
FIG. 6 is an explanatory diagram illustrating a yet further specific example, under the present invention, of a method of manufacturing a molding form utilized in fabricating a semiconductor heat-dissipating substrate composed of a central portion and a peripheral portion that differ in material properties.
Figure 6B:
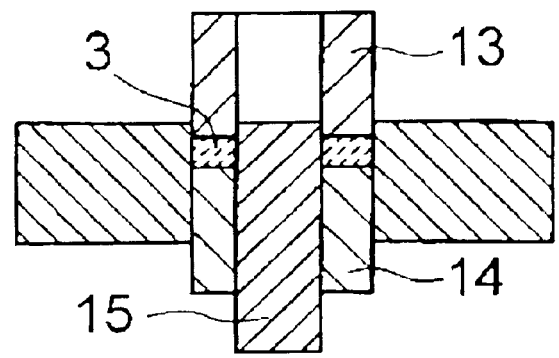
Figure 6C:
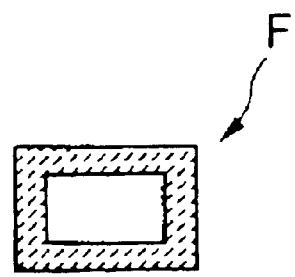

(6) As indicated in FIG. 6, an NC press, having a hole in the center of an upper punch 13 and of a lower punch 14, and in which a core pin 15 of the same diameter as the hole is stood, was employed; and as in (a) the press was charged with a W powder 3, being Powder No. 5 in above-noted Table I; then by press-working as in (b), a molded object F as in (c), having in its central portion a through-hole corresponding to the location of the core pin 15, was fabricated.

From the molded objects thus fabricated the organic binder was eliminated in the same manner as with Embodiment 2, and afterwards copper was infiltrated into molded objects A through C according to the same method as with Embodiment 1, and copper was infiltrated into molded objects D and E according to the same method as with Embodiment 1 while at the same time the recesses and perforations were filled with copper. Copper was furthermore infiltrated into molded object F according to the same method as with Embodiment 1, after which a copper piece of the same form as the through-hole in the middle was pressed into it and bonded by a heating process carried out at 1050° C.

Thereafter, shot-blasting employed to remove excess copper stuck on the periphery, and polishing carried out on both the upper and lower surfaces produced semiconductor heat-dissipating substrates comprising a central portion and a peripheral portion that differ in substantive material, and in between the central and peripheral portions of which neither a brazing material nor a bonding-substance layer was present. That the thermal conductivity and the thermal expansion coefficient in the central and peripheral portions of any given one of the obtained semiconductor heat-dissipating substrates differed was confirmed.

Embodiment 4

Utilizing the W powder (no additive metal) that is Powder No. 5 in above-noted Table I, and following method (1) of Embodiment 3, a molded object the central and peripheral portions of which differ in vesicle quantity was fabricated; and by infiltrating copper into it likewise as with Embodiment 1, a semiconductor heat-dissipating substrate was manufactured. The thermal conductivity of the semiconductor heat-dissipating substrate was 244 W/m·K in the central portion and 217 W/m·K in the peripheral portion, while the thermal expansion coefficient was $8.3 \times 10^{-6}/°$ C. in the central portion and $6.5 \times 10^{-6}/°$ C. in the peripheral portion.

Figure 10A:
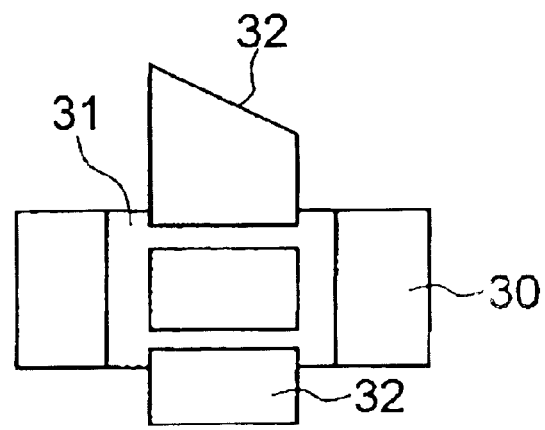
FIG. 10 depicts a specific example of a package for high-frequency devices, fabricated utilizing a semiconductor heat-dissipating substrate in the present invention; wherein (a) is a schematic plan view thereof, and (b) a schematic side view.
Figure 10B:
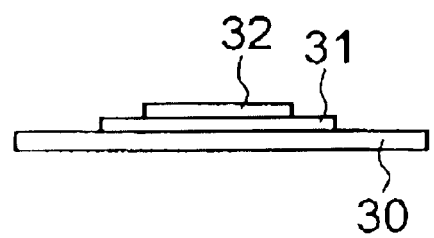

A package and a semiconductor device were actually fabricated utilizing this semiconductor heat-dissipating substrate. In particular, semiconductor heat-dissipating substrate 30 as represented in FIG. 10, 30×15×2 mm was manufactured, and was superficially plated with Ni 1 $\mu$m in thickness. A ceramic seal ring 31 made of alumina, and an electrode terminal 32 made of Fe—Ni—Co alloy were brazed onto the obverse surface, whereby a package for a high-frequency device was fabricated. The plurality of packages that were produced was assayed for bottom-surface warpage, wherein it was confirmed to be 1 $\mu$m or less per millimeter length in any given one. Here, warpage was assayed by placing a test piece onto a platen and running a dial gauge (scanning distance 29 mm) in the directions of the two diagonals in the rectangular (30 mm×10 mm) principal face, measuring the maximum and minimum values of the height from the platen, finding two values that are the maximum value of the height-value differences, divided by the gauged length of the diagonals, and taking the larger of values as the sample warpage.

The package was thereafter plated with Ni and was further plated with Au. On the semiconductor-element-carrying portion thereof, a chip made of GaAs was joined with Au—Ge solder. A heat-cycling test in which temperature ascent/descent of −65° C.×10 min and +150° C.×10 min was repeated 200 cycles was performed, but no abnormalities could be detected. Subsequently, the semiconductor device was screwed fast to a substrate made of copper and the GaAs chip was actually put into operation, wherein normal functioning was confirmed.

Embodiment 5

3 weight % Cu powder of 5 $\mu$m average particle diameter was added to and mixed with W powder of 13 $\mu$m average particle diameter, containing as iron-group impurities 6 ppm Fe, 3 ppm Ni and 2 ppm Co. This powder mixture was introduced into a stirring mixer, was joined by an acrylic organic binder at 0.1 weight % with respect to the net weight, and was then mixed 1 hour using alcohol as a mixing medium, whereby secondary particles approximately 85 $\mu$m in average particle diameter were fabricated.

The amount of Fe and Ni in the impurities contained in the obtained powder mixtures was ascertained; admixing in the course of the mixing procedure was nonexistent, however, with there being no change from when the mixing was first begun. Subsequently, flat-plate-shaped molded objects 30×15×2.5 mm were fabricated by molding the powders in a powder-molding press. In this case, an NC multi-shaft press, in which lower punches operate separately in inner and peripheral sections, was employed; and by varying the compression on the powder in the central and peripheral portions 20 kinds of molded objects, whose density—i.e., vesicle quantity—in the central and peripheral portions differ, were produced.

The binder component was eliminated from the molded objects by heating them in a hydrogen gas stream 1 hour at 400° C., followed by 1 hour at 900° C. Next they were sintered in a hydrogen gas stream at 1300° C.; copper sheet sufficient to fill the volume of vesicles in the sintered objects was prepared; the sintered objects were set onto the copper sheet; and by heating to 1200° C. in a hydrogen gas stream, the copper was infiltrated into the vesicles, whereby Cu—W alloys were produced. They were thereafter 900° C. heat-treated for 1 hour, and excess copper stuck on their periphery was removed employing shot-blasting, whereupon by polishing the upper and lower surfaces, semiconductor heat-dissipating substrates were produced.

The obtained semiconductor heat-dissipating substrates are as indicated in Table V below: The amount of Cu in the central portion was of two classes, 35 weight % and 45 weight %, and the thermal conductivity of the central portions was 262 W/m·K and 280 W/m·K respectively. Likewise, the amount of Cu in the peripheral portion had values of every 1 weight % from 7 weight % through 16 weight %.

A semiconductor device was actually fabricated utilizing this semiconductor heat-dissipating substrate. The semiconductor device represented in FIG. 11 has U-shaped grooves 33a formed in the right/left of a 30 mm×15 mm×2 mm semiconductor heat-dissipating substrate 33 by a machining process. Ni 5 $\mu$m in thickness was plated onto this substrate 33, onto which Ni—P 0.5 $\mu$m in thickness was further plated, and which was thereafter heat-treated at 800° C. in a hydrogen gas stream. Next a ceramic seal ring 34a, and an electrode terminal 35 made of Fe—Ni—Co alloy were brazed onto the substrate 33. It was thereafter plated with Ni and was further plated with Au, whereby a package for a high-frequency device was fabricated.

Figure 11A:
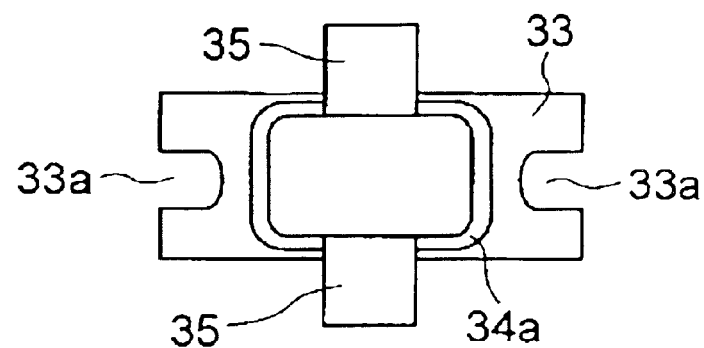
FIG. 11 depicts another specific example of a package for high-frequency devices, fabricated utilizing a semiconductor heat-dissipating substrate in the present invention; wherein (a) is a schematic plan view thereof, and (b) a schematic side view.
Figure 11B:
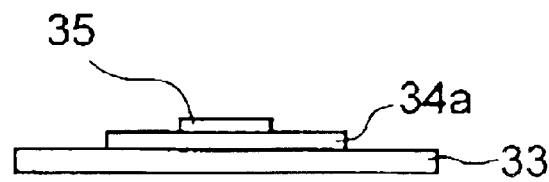
Figure 12A:
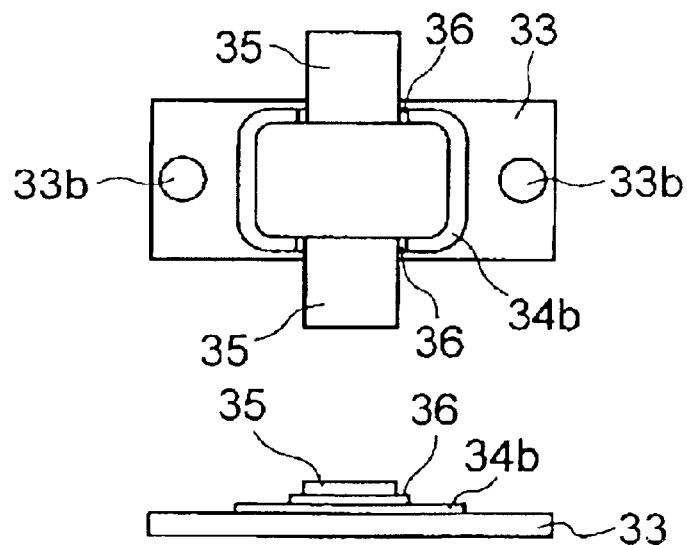
FIG. 12 depicts yet another specific example of a package for high-frequency devices, fabricated utilizing a semiconductor heat-dissipating substrate in the present invention; wherein (a) is a schematic plan view thereof, and (b) a schematic side view.
Figure 12B:
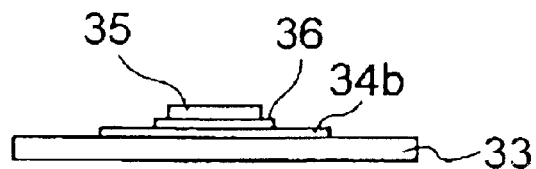

Meanwhile, the semiconductor device represented in FIG. 12 has holes 33b formed in the right/left of a 30 mm×15 mm×2 mm semiconductor heat-dissipating substrate 33 by a machining process. This semiconductor device is different in that in contrast to the FIG. 11 device, a ceramic insulating plate 36 is brazed in between a seal ring 34b made of Fe—Ni—Co alloy, and the electrode terminal 35 made of Fe—Ni—Co alloy.

Bottom-surface warpage on these packages was assayed likewise as with Embodiment 4 (scanning distance 29 mm), and the results are set forth in Table V below. For warpage direction herein, with the seal ring as up, the direction in which the central portion would make earthing contact was taken to be the + direction. Making the Cu quantity in the peripheral portion be 15 weight % or less made it possible to make the warpage 1 $\mu$m or less per millimeter. For the case moreover in which the surrounding mechanical device in FIG. 11 is of alumina, making the Cu quantity in the peripheral portion be 10 weight % or less made it possible to make the warpage 1 $\mu$m or less per millimeter. What is more, the warpage direction could be rendered in the direction the central portion makes earthing contact.

TABLE V

| Sample | Cu qty. (wt. %) Central portion | Cu qty. (wt. %) Peripheral portion | Post-plating warpage (μm) | Warpage (μm) FIG. 11 | Warpage (μm) FIG. 12 |
|---|---|---|---|---|---|
| 31 | 35 | 7 | 6 | 13 | 22 |
| 32 | 35 | 8 | 6 | 10 | 20 |
| 33 | 35 | 9 | 6 | 4 | 15 |
| 34 | 35 | 10 | 6 | −5 | 10 |
| 35 | 35 | 11 | 7 | −14 | 2 |
| 36 | 35 | 12 | 7 | −30 | −7 |
| 37 | 35 | 13 | 8 | −50 | −15 |
| 38 | 35 | 14 | 8 | −73 | −19 |
| 39 | 35 | 15 | 8 | −95 | −25 |
| 40 | 35 | 16 | 8 | −110 | −28 |
| 41 | 45 | 7 | 7 | 5 | 28 |
| 42 | 45 | 8 | 8 | 0 | 25 |
| 43 | 45 | 9 | 8 | −8 | 22 |
| 44 | 45 | 10 | 8 | −15 | 15 |
| 45 | 45 | 11 | 8 | −31 | 13 |
| 46 | 45 | 12 | 8 | −45 | 10 |
| 47 | 45 | 13 | 8 | −60 | 2 |
| 48 | 45 | 14 | 9 | −80 | −6 |
| 49 | 45 | 15 | 9 | −100 | −29 |
| 50 | 45 | 16 | 9 | −120 | −35 |

Embodiment 6

W powders of the 6 kinds differing in iron-group impurity and particle diameter distribution, set forth in Table I from Embodiment 1, were readied. The additive metals set forth in Table VI below were mixed into these W powders. These powder mixtures were introduced into a stirring mixer, was weight, and was then mixed 1 hour using alcohol as a mixing medium, whereby secondary particles approximately 85 μm in average particle diameter were fabricated.

The amount of Fe and Ni in the iron-group impurities contained in the obtained powder mixtures was ascertained; admixing in the course of the mixing procedure was nonexistent, however, with there being no change from when the mixing was first begun. Subsequently, flat-plate-shaped molded objects 30×15×2.5 mm were fabricated by molding these mixed powders in a powder-molding press. In this case, an NC multi-shaft press, in which lower punches operate separately in inner and peripheral sections, was employed; and by varying the compression on the powder in the central and peripheral portions, molded objects whose density—i.e., vesicle quantity—in the central and peripheral portions differ were produced.

The binder component was eliminated from the molded objects by heating them in a hydrogen gas stream 1 hour at 400° C., followed by 1 hour at 900° C. Next they were sintered in a hydrogen gas stream at 1300° C.; copper sheet sufficient to fill the volume of vesicles in the sintered objects was prepared; the sintered objects were set onto the copper sheet; and by heating to 1200° C. in a hydrogen gas stream, the copper was infiltrated into the vesicles, whereby Cu—W alloys were produced. They were then heat-treated at 900° C. for 1 hour; thereafter by employing shot-blasting to remove excess copper stuck on their periphery and polishing the upper and lower surfaces, semiconductor heat-dissipating substrates were produced.

The amount of Cu in the central portion of the obtained semiconductor heat-dissipating substrates was 40 weight %, and the thermal conductivity of the middle part was 273 W/m·K. Likewise, the amount of Cu in the peripheral portion was 8 weight %. The package represented in FIG. 11 for a high-frequency device was fabricated utilizing the obtained semiconductor heat-dissipating substrates in the same way as with Embodiment 5.

The packages were assayed for bottom-surface warpage according to the same method as with Embodiment 4 (scanning distance 30 mm). The maximum and minimum values, as well as the average values, from the measurement results are set forth in the following Table VI. The dimension in the longitudinal direction was furthermore measured, and a value that is the difference between the maximum and minimum values divided by the average value was defined to be the dimensional fluctuation per millimeter. Rendering the amount of iron-group impurity contained in the semiconductor heat-dissipating substrates be 0.02 weight % or less made for dimensional fluctuation of 2 μm or less per millimeter and made for reducing warpage irregularities to 40 μm or less. Moreover, by making the average particle diameter of the W powders be 5 to 20 μm warpage fluctuations could be controlled to 20 μm or less; desirably rendering it 10 to 20 μm made bringing dimensional fluctuations to 1 μm or less per millimeter possible, and enabled coordinating the direction of warpage.

TABLE VI

| Sample no. | W powder (μm) | Additive metal (wt. %) Fe | Additive metal (wt. %) Ni | Additive metal (wt. %) Cu | Dimensional fluctuation (μm) | Warpage (μm) Max. | Warpage (μm) Min. | Warpage (μm) Avg. |
|---|---|---|---|---|---|---|---|---|
| 51 | 2 | 0 | 0 | 3 | 1.3 | 25 | −10 | 5 |
| 52 | 3 | 0 | 0 | 3 | 1.2 | 18 | −8 | 5 |
| 53 | 4 | 0 | 0 | 3 | 0.6 | 15 | 0 | 6 |
| 54 | 5 | 0 | 0 | 3 | 0.7 | 14 | 2 | 5 |
| 55 | 6 | 0 | 0 | 3 | 0.8 | 14 | 1 | 6 |
| 56 | 7 | 0 | 0 | 3 | 0.9 | 15 | 2 | 6 |
| 57 | 5 | 0 | 0.02 | 0 | 2.1 | 28 | −15 | 7 |
| 58 | 5 | 0 | 0.02 | 3 | 1.9 | 30 | −15 | 7 |
| 59 | 5 | 0 | 0.1 | 0 | 2.5 | 32 | −15 | 7 |
| 60 | 5 | 0.1 | 0 | 0 | 2.9 | 32 | −16 | 7 |
| 61 | 5 | 0 | 0.1 | 3 | 2.5 | 32 | −17 | 7 |

Embodiment 7

Submount samples S1 through S25 set forth in the following Table VII in Embodiment 2 were fabricated utilizing the Cu—W materials from samples 4, 9, 17 and 20 in Table IV, fabricated in Embodiment 2. In particular, the submount substrates were rendered by cutting each Cu—W material into 1.8×0.6×0.3 mm and chamfering the edge portion at chamfer dimension C indicated in FIG. 7.

The submount substrates were electroplated over their entire surface with a 2 μm thickness of Ni as an adhesive layer and underwent a sintering process under a hydrogen atmosphere at 600° C. Next a thin Pt film was formed as an anti-dispersion layer onto the Ni plating by sputtering so as to be a film 1 μm in thickness on the principal and reverse faces, and a film 0.7 μm in thickness on the side faces.

A solder layer was further formed on the anti-dispersion layer. The substantive material of the solder layer, the film thickness of the principal and side surfaces, and the number of formed solder-layer side faces, are as entered in Table VII below. Here, a solder layer of the same thickness as that on the principal face was formed on the reverse face also. Further, the method of forming the solder layer was, for samples S16, S17 and S18, by sputtering; and for the rest of the samples entirely, vacuum vapor deposition was employed.

TABLE VII

| Sample | Cu—W material (Table V) | Chamfer dimension C(μm) | Solder layer Substance | Principal-face film thickness | No. side faces formed | Side-face film thickness |
|---|---|---|---|---|---|---|
| S1 | 39 | <5.0 | Au:Sn = 8:2 | 3.0 | 4 | 0.8 |
| S2 | 34 | <5.0 | Au:Sn = 8:2 | 3.0 | 4 | 0.8 |
| S3 | 50 | <5.0 | Au:Sn = 8:2 | 3.0 | 4 | 0.8 |
| S4 | 47 | <5.0 | Au:Sn = 8:2 | 3.0 | 4 | 0.8 |
| S5 | 34 | 8 | Au:Sn = 8:2 | 3.0 | 4 | 0.8 |
| S6 | 34 | 28 | Au:Sn = 8:2 | 3.0 | 4 | 0.8 |
| S7 | 34 | 40 | Au:Sn = 8:2 | 3.0 | 4 | 0.8 |
| S8 | 50 | 8 | Au:Sn = 8:2 | 3.0 | 4 | 0.8 |
| S9 | 50 | 28 | Au:Sn = 8:2 | 3.0 | 4 | 0.8 |
| S10 | 50 | 40 | Au:Sn = 8:2 | 3.0 | 4 | 0.8 |
| S11 | 47 | 8 | Au:Sn = 8:2 | 3.0 | 4 | 0.8 |
| S12 | 47 | 28 | Au:Sn = 8:2 | 3.0 | 4 | 0.8 |
| S13 | 47 | 40 | Au:Sn = 8:2 | 3.0 | 4 | 0.8 |
| S14 | 34 | <5.0 | Au:Sn = 8:2 | 3.0 | 4 | 0.8 |
| S15 | 34 | <5.0 | Au:Sn = 8:2 | 3.0 | 1 (light-emitting face) | 0.8 |
| S16 | 39 | <5.0 | Au:Sn = 8:2 | 4.5 | 4 | 2.2 |
| S17 | 34 | <5.0 | Au:Sn = 8:2 | 3.0 | 4 | 1.5 |
| S18 | 34 | <5.0 | Au:Sn = 8:2 | 3.0 | 4 | 1.1 |
| S19 | 34 | <5.0 | Au:Sn = 8:2 | 4.0 | 4 | 0.5 |
| S20 | 34 | <5.0 | Au:Sn = 8:2 | 2.0 | 4 | 0.3 |
| S21 | 34 | <5.0 | Au:Sn = 8:2 | 1.0 | 4 | 0.8 |
| S22 | 39 | <5.0 | Ag:Sn = 4:6 | 3.0 | 4 | 0.8 |
| S23 | 34 | <5.0 | Ag:Sn = 4:6 | 3.0 | 4 | 0.8 |
| S24 | 50 | <5.0 | Ag:Sn = 4:6 | 3.0 | 4 | 0.8 |
| S25 | 47 | <5.0 | Ag:Sn = 4:6 | 3.0 | 4 | 0.8 |

(Note: Under solder-layer substances, compositions are indicated in weight rations. Solder-layer film thickness is in μm units.)

Next, Cu—W base material from the samples fabricated in the embodiments was utilized as a stem for connection to each of these submounts and superficially plated with Au 3 μm in thickness. Furthermore, a GaAs-semiconductor laser diode (LD) element was readied. The LD element is a bottom-emitting type that has an output capacity of 400 mW, is width 0.3 mm×length 1.2 mm×thickness 0.15 mm in form, and has a light-emitting portion in a section 0.03 mm from the bottom face.

The LD element was joined onto the principal face, and the stem simultaneously on the reverse face, of each submount by means of respective solder layers. The condition of the joint between the stem and the submount, as well as the light-emitting efficiency of the LD elements, in each of the obtained semiconductor devices was evaluated, and the results are set forth in Table VIII below. At first meniscus dimension h was found by measuring the size of the meniscus of solder formed at the joint between the stem and the submount under 100-times microscopic observation.

The joint strength of the submount with respect to the stem was measured using the Die Shear Test based on MIL-STD-883C method 2019.4, and the average particle diameter of 10 articles of each sample was found. A joint strength of 50 MPa or more was denoted by "v. hi"; 40 MPa or more and less than 50 MPa, by "hi"; 30 MPa or more and less than 40 MPa, by "med"; and less than 30 MPa, by "low." Further, the presence/absence of cracks in the joint portion of the submount stem was surveyed under 150-times microscopic observation. Crack observations 1 in Table VIII are the results of direct post-joining observation; while crack observation 2 represents observation results after a heat cycling test in which a heat cycle of −40° C.×30 min to +150° C.×30 min was implemented 100 rounds.

Furthermore, 10 semiconductor devices apiece for the remaining samples were caused to actually emit light, and a count of the elements that emitted light and an average value of the light-emitting efficiency were found. The light-emitting element count indicated, among 20 LD elements mounted together with the samples, a count of those elements from which laser light was emitted with no shielding due to solder bulges on the light-emitting surface. Likewise, luminescence direct post-joining was taken as luminescence 1, while luminescence following a heat-cycle test in which a heat cycle of −40° C.×30 min to +150° C.×30 min was implemented 100 rounds was taken as luminescence 2; and any that was 80% or more was entered as "v. hi"; 70% or more and less than 80%, as "hi"; 50 or more and less than 70%, as "med"; and less than 50%, as "low."

TABLE VIII

| | Stem-to-submount joint | | | | Laser diode | | |
|---|---|---|---|---|---|---|---|
| Sample | Meniscus dimension (μm) | Joint strength | Crack observation 1 | Crack observation 2 | Element count | Conversion efficiency 1 | Conversion efficiency 2 |
| S1 | 96 | v. hi | Absence | Absence | 20/20 | v. hi | v. hi |
| S2 | 104 | v. hi | Absence | Absence | 20/20 | v. hi | v. hi |
| S3 | 92 | v. hi | Absence | Absence | 20/20 | hi | hi |
| S4 | 98 | v. hi | Absence | Absence | 20/20 | hi | hi |
| S5 | 76 | v. hi | Absence | Absence | 20/20 | v. hi | v. hi |
| S6 | 35 | v. hi | Absence | Absence | 20/20 | hi | hi |
| S7 | 25 | hi | Absence | Absence | 20/20 | hi | med |
| S8 | 72 | v. hi | Absence | Absence | 20/20 | hi | med |
| S9 | 36 | v. hi | Absence | Absence | 20/20 | med | med |
| S10 | 22 | hi | Absence | Absence | 20/20 | med | low |
| S11 | 70 | v. hi | Absence | Absence | 20/20 | med | med |
| S12 | 44 | v. hi | Absence | Absence | 20/20 | med | med |
| S13 | 18 | hi | Absence | Absence | 20/20 | low | low |
| S14 | 6 | low | Absence | Presence | 17/20 | v. hi | v. hi |
| S15 | Light-emitting: 86; others: 6 | hi | Absence | Presence | 20/20 | v. hi | v. hi |
| S16 | 192 | v. hi | Absence | Absence | 18/20 | v. hi | v. hi |
| S17 | 185 | v. hi | Absence | Absence | 20/20 | v. hi | v. hi |
| S18 | 190 | v. hi | Absence | Absence | 20/20 | v. hi | v. hi |

TABLE VIII-continued

| | Stem-to-submount joint | | | | Laser diode | | |
| --- | --- | --- | --- | --- | --- | --- | --- |
| | Meniscus | | | | | | |
| Sample | dimension (μm) | Joint strength | Crack observation 1 | Crack observation 2 | Element count | Conversion efficiency 1 | Conversion efficiency 2 |
| S19 | 144 | v. hi | Absence | Absence | 20/20 | v. hi | v. hi |
| S20 | 72 | v. hi | Absence | Absence | 20/20 | v. hi | v. hi |
| S21 | 28 | hi | Absence | Absence | 20/20 | hi | med |
| S22 | 88 | v. hi | Absence | Absence | 20/20 | v. hi | v. hi |
| S23 | 100 | v. hi | Absence | Absence | 20/20 | hi | hi |
| S24 | 92 | v. hi | Absence | Absence | 20/20 | med | med |
| S25 | 88 | v. hi | Absence | Absence | 20/20 | med | med |

(Note: The meniscus is the same on all sides; in Sample 15 only is there a disparity between that on the light-emitting face and on the other faces.)

INDUSTRIAL APPLICABILITY

The present invention makes it possible to provide semiconductor heat-dissipating substrates, submounts, and semiconductor devices, made from a Cu—W alloy whose thermal conductivity is enhanced over the conventional by eliminating or reducing the addition of iron-family metal that had been essential to copper infiltration, yet without leftover copper and like production problems. Moreover, combining Cu—W alloy and copper in which a plurality of the compositions differ makes for manufacturing at low cost semiconductor heat-dissipating substrates in which the thermal conductivity and thermal expansion coefficient in the central portion and in the peripheral portion differ, and makes it possible to offer packages and semiconductor devices in which warpage is small and thermal conductivity is high.

What is claimed is:

1. A semiconductor heat-dissipating substrate made of a copper-tungsten alloy being a porous tungsten body into the pores of which copper has been infiltrated, the semiconductor heat-dissipating substrate characterized in that pore diameter of said porous tungsten body at a specific cumulative surface area of 95% is 0.3 μm or more, and pore diameter of said porous tungsten body at a specific cumulative surface area of 5% is 30 μm or less.

2. The semiconductor heat-dissipating substrate set forth in claim 1, wherein content of iron-family metal within said copper-tungsten alloy is less than 0.02 weight %.

3. The semiconductor heat-dissipating substrate set forth in claim 1, wherein pore diameter of said porous tungsten body at a specific cumulative surface area of 95% is 0.5 μm or more.

4. The semiconductor heat-dissipating substrate set forth in claim 3, wherein content of iron-family metal within said copper-tungsten alloy is 0.002 weight % or less.

5. The semiconductor heat-dissipating substrate set forth in claim 1, wherein the tungsten in said porous tungsten body has an average grain size of 5 to 20 μm.

6. The semiconductor heat-dissipating substrate set forth in claim 1, wherein the tungsten in said porous tungsten body has an average grain size of 10 to 20 μm.

7. The semiconductor heat-dissipating substrate set forth in claim 1, wherein its tungsten is present at 91 to 75 weight %, and its thermal conductivity is 210 W/m·K or more.

8. The semiconductor heat-dissipating substrate set forth in claim 1, wherein its tungsten is present at 81 to 75 weight %, and its thermal conductivity is 230 W/m·K or more.

9. A package utilizing the semiconductor heat-dissipating substrate of claim 1, wherein a seal ring and an electrode terminal are brazed on the peripheral portion of the semiconductor heat-dissipating substrate, or peripherally on the semiconductor-element-carrying central portion.

10. The package set forth in claim 9, wherein warpage in said semiconductor heat-dissipating substrate after said seal ring and said electrode terminal have been brazed onto it is 1 μm or less per millimeter length.

11. The package set forth in claim 9, wherein said seal ring is made of alumina.

12. The package set forth in claim 9, wherein its longitudinally-directed warpage is in a direction in which its central portion makes grounding contact.

13. A submount comprising:
 a submount substrate utilizing the semiconductor heat-dissipating substrate of claim 1, and
 a solder layer on an optical-semiconductor-element-carrying principal face of said submount substrate.

14. The submount set forth in claim 13, wherein a chamfer edgewise on said optical-semiconductor-element-carrying principal face measures 30 μm or less.

15. The submount set forth in claim 13, wherein on at least one side face of said submount a solder layer is formed continuously from said solder layer on the principal face.

16. The submount set forth in claim 15, wherein on all side faces of said submount a solder layer is formed continuously from said solder layer on the principal face.

17. The submount set forth in claim 13, wherein a solder layer is formed on a reverse face of said submount, on a side thereof opposite said principal face.

18. The submount set forth in claim 13, further comprising an adhesive layer formed in direct superficial contact with said submount.

19. The submount set forth in claim 18, further comprising an anti-dispersion layer between said adhesive layer and said solder layer.

20. A semiconductor device wherein an optical semiconductor element is mounted in place on the submount of claim 13, and a stem is connected to the reverse face on its opposite side.

* * * * *